(12) United States Patent
Zhu et al.

(10) Patent No.: US 10,417,967 B2
(45) Date of Patent: Sep. 17, 2019

(54) DISPLAY PANEL AND DISPLAY DEVICE

(71) Applicant: SHANGHAI TIANMA AM-OLED CO., LTD., Shanghai (CN)

(72) Inventors: Renyuan Zhu, Shanghai (CN); Yana Gao, Shanghai (CN); Yue Li, Shanghai (CN); Zeyuan Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 84 days.

(21) Appl. No.: 15/863,967

(22) Filed: Jan. 7, 2018

(65) Prior Publication Data
US 2018/0130418 A1    May 10, 2018

(30) Foreign Application Priority Data

Aug. 15, 2017   (CN) .......................... 2017 1 0697141

(51) Int. Cl.
*G09G 3/3233* (2016.01)
*G09G 3/3258* (2016.01)
(Continued)

(52) U.S. Cl.
CPC ......... *G09G 3/3258* (2013.01); *G09G 3/3233* (2013.01); *H01L 27/3262* (2013.01);
(Continued)

(58) Field of Classification Search
CPC ......... G09G 3/3233; G09G 2320/0233; G09G 2320/043; G09G 2300/0852;
(Continued)

(56) References Cited

U.S. PATENT DOCUMENTS 9,324,265 B2 *  4/2016 Han .................... G09G 3/3233
2016/0042694 A1   2/2016 Lim et al.
(Continued)

FOREIGN PATENT DOCUMENTS

CN   103268756 A   8/2013
CN   103871362 A   6/2014
(Continued)

*Primary Examiner* — Duc Q Dinh
(74) *Attorney, Agent, or Firm* — Kilpatrick Townsend & Stockton LLP

(57) ABSTRACT

The present disclosure discloses a display panel and a display device. The display panel includes a plurality of pixel circuits, and each of the pixel circuit includes an initialization component, a data writing component, a light emitting control component, a voltage storage component, a driving transistor, a first voltage maintenance component, a switching control component, an external compensation component and a light-emitting diode. The driving transistor is a dual-gate transistor, and a second gate of the dual-gate transistor is electrically connected to the external compensation component through the switching control component. The external compensation component is under the control of the switching control component to firstly collect the voltage at a third node and then provide a compensation voltage to a second node to adjust the threshold voltage of the dual-gate transistor so that the threshold voltage of the dual-gate transistor is more approximate to a standard threshold voltage.

20 Claims, 16 Drawing Sheets

(51) Int. Cl.
*H01L 27/32* (2006.01)
*H01L 29/786* (2006.01)
*H01L 27/12* (2006.01)
*G09G 3/20* (2006.01)

(52) U.S. Cl.
CPC ...... *H01L 27/3265* (2013.01); *H01L 27/3276* (2013.01); *H01L 29/78648* (2013.01); *G09G 3/2088* (2013.01); *G09G 2300/043* (2013.01); *G09G 2300/0819* (2013.01); *G09G 2300/0852* (2013.01); *G09G 2300/0861* (2013.01); *G09G 2320/0257* (2013.01); *G09G 2320/043* (2013.01); *G09G 2320/045* (2013.01); *H01L 27/124* (2013.01); *H01L 27/1255* (2013.01)

(58) Field of Classification Search
CPC ........... G09G 3/3258; G09G 2300/043; G09G 2320/0626; G09G 2330/10; G09G 2310/0243; G09G 2320/0209; G09G 2320/0252; G09G 2320/0219; G09G 2230/45

USPC .......................... 345/76, 77, 78, 82, 83, 84
See application file for complete search history.

(56) References Cited

U.S. PATENT DOCUMENTS

2016/0314742 A1* 10/2016 Zhou .................... G09G 3/3258
2018/0268757 A1*  9/2018 Chen .................... G09G 3/3233

FOREIGN PATENT DOCUMENTS

| CN | 104732927 A | 6/2015 |
| CN | 105741779 A | 7/2016 |
| CN | 105741781 A | 7/2016 |
| CN | 106328061 A | 1/2017 |
| CN | 106504707 A | 3/2017 |

* cited by examiner

DISPLAY PANEL AND DISPLAY DEVICE

CROSS-REFERENCE TO RELATED APPLICATIONS

This application claims the priority to Chinese Patent Application No. 201710697141.7, filed on Aug. 15, 2017, the content of which is hereby incorporated by reference in its entirety.

FIELD

This application relates to the technical field of displaying, in particular to a pixel circuit, a driving method thereof, an electroluminescent display panel and a display device.

BACKGROUND

An Organic Light Emitting Display (OLED), which is a current-driven display, requires a steady current to drive it to emit light. Due to the process procedure, device aging and the like, the threshold voltage ($V_{th}$) of a driving transistor in a pixel circuits is prone to drift, resulting in display unevenness and afterimages.

Currently, there are generally two ways to avoid the drift of the threshold voltage. The first way is using a pixel circuit having internal compensation to compensate the threshold voltage of the driving transistor, and the second way is using an external compensation circuit to compensate the threshold voltage of the driving transistor in the pixel circuit to alleviate the problems of display unevenness and afterimages.

However, with a pixel circuit having internal compensation, it is difficult to adjust the threshold voltage to a standard threshold voltage. Therefore, the threshold voltage inevitably may still drift. When an external compensation circuit is used, a common method is to add a variation of the threshold voltage to a data signal to realize the compensation of the threshold voltage. However, this method is far from alleviating the drift of the threshold voltage but worsens the drift of the threshold voltage; for example, when the threshold voltage drifts positively under a positive bias, if the increasing threshold voltage is added to a data signal through an external compensation circuit, the positive bias may become larger, causing more serious positive drift of the threshold voltage and therefore worsening the afterimage problem.

SUMMARY

An embodiment of the present disclosure provides a display panel including a plurality of pixel circuits, each of the pixel circuits including: an initialization component, a data writing component, a light emitting control component, a voltage storage component, a driving transistor, a first voltage maintenance component, a switching control component, an external compensation component and a light-emitting diode. The driving transistor is a dual-gate transistor, and is configured to drive the light-emitting diode to emit light. The data writing component is configured to transmit to a first gate of the dual-gate transistor a signal input from a data signal terminal. The initialization component is configured to transmit to a second gate of the dual-gate transistor a reference signal input from a reference signal terminal, and transmit to a drain of the dual-gate transistor an initial signal input from an initial signal terminal. The light emitting control component is configured to transmit to a source of the dual-gate transistor a first voltage signal input from a first voltage signal terminal. The voltage storage component is configured to store a potential of a data signal input from the data signal terminal. The first voltage maintenance component is configured to maintain a potential of the drain of the dual-gate transistor, or maintain a voltage difference between the second gate and the drain of the dual-gate transistor. The switching control component is configured to transmit the potential of the drain of the dual-gate transistor to the external compensation component, and transmit to the second gate of the dual-gate transistor a compensation voltage provided by the external compensation component. The external compensation component is configured to provide a compensation voltage for the dual-gate transistor.

In another aspect, an embodiment of the present disclosure further provides a display panel including a plurality of pixel circuits, each of the pixel circuits including: an initialization component, a data writing component, a light emitting control component, a voltage storage component, a driving transistor, a first voltage maintenance component, a switching control component, an external compensation component and a light emitting diode. The data writing component is electrically connected to a first scan signal terminal at a first terminal, is electrically connected to a data signal terminal at a second terminal, and is electrically connected to a first node at a third terminal. The data writing component is configured to transmit to the first node a signal input from the data signal terminal, under the control of the first scan signal input from the first scan signal terminal. The initialization component is electrically connected to a second scan signal terminal at a first terminal, is electrically connected to a reference signal terminal at a second terminal, is electrically connected to a second node at a third terminal, is electrically connected to a third scan signal terminal at a fourth terminal, is electrically connected to an initial signal terminal at a fifth terminal, and is electrically connected to a third node at a sixth terminal. The initialization component is configured to transmit to the second node a reference signal input from the reference signal terminal under the control of a second scan signal input from the second scan signal terminal and transmit to the third node an initial signal input from the initial signal terminal under the control of a third scan signal input from the third scan signal terminal. The first voltage maintenance component is electrically connected to the second node at a first terminal, and is electrically connected to the third node at a second terminal. The first voltage maintenance component is configured to maintain a potential of the third node under the control of a potential of the second node, and maintain a voltage difference between the second node and the third node. The light emitting control component is electrically connected to a light emitting control signal terminal at a first terminal, is electrically connected to a first voltage signal terminal at a second terminal, and is electrically connected to a source of the dual-gate transistor at a third terminal. The light emitting control component is configured to transmit to the source of the dual-gate transistor a first voltage signal input from the first voltage signal terminal under the control of a light-emitting control signal input from the light-emitting control signal terminal. The voltage storage component is connected between the first voltage signal terminal and the first node. The driving transistor is a dual-gate transistor, the dual-gate transistor is electrically connected to the first node at a first gate, is electrically connected to the second node at a second gate, and is electrically connected to the third node at the drain. The switching control component is electrically connected to a fourth scan signal terminal at a first terminal, is electrically connected to the third node at a second terminal, is electrically connected to a fourth node at a third terminal, is electrically connected to a fifth scan signal terminal at a fourth terminal, is electrically connected to the second node at a fifth terminal, and is electrically connected to a signal output terminal of the external compensation component at a sixth terminal. The switching control component is configured to provide a potential of the third node to the fourth node under the control of a fourth scan signal input from the fourth scan signal terminal, and transmit to the second node a signal output by the signal output terminal of the external compensation component under the control of a fifth scan signal input from the fifth scan signal terminal. The external compensation component is electrically connected to the fourth node at a first signal input terminal, and is electrically connected to the reference signal terminal at a second signal input terminal. The external compensation component is configured to collect the voltage of the third node, and provide a compensation voltage to the second node under the control of the switching control component. The light-emitting diode is connected between the third node and a second voltage signal terminal.

In another aspect, an embodiment of the present disclosure further provides a display device. The display device includes a display panel including a plurality of pixel circuits, each of the pixel circuits including: an initialization component, a data writing component, a light emitting control component, a voltage storage component, a driving transistor, a first voltage maintenance component, a switching control component, an external compensation component and a light emitting diode. The data writing component is electrically connected to a first scan signal terminal at a first terminal, is electrically connected to a data signal terminal at a second terminal, and is electrically connected to a first node at a third terminal. The data writing component is configured to transmit to the first node a signal input from the data signal terminal, under the control of the first scan signal input from the first scan signal terminal. The initialization component is electrically connected to a second scan signal terminal at a first terminal, is electrically connected to a reference signal terminal at a second terminal, is electrically connected to a second node at a third terminal, is electrically connected to a third scan signal terminal at a fourth terminal, is electrically connected to an initial signal terminal at a fifth terminal, and is electrically connected to a third node at a sixth terminal. The initialization component is configured to transmit to the second node a reference signal input from the reference signal terminal under the control of a second scan signal input from the second scan signal terminal and transmit to the third node an initial signal input from the initial signal terminal under the control of a third scan signal input from the third scan signal terminal. The first voltage maintenance component is electrically connected to the second node at a first terminal, and is electrically connected to the third node at a second terminal. The first voltage maintenance component is configured to maintain a potential of the third node under the control of a potential of the second node, and maintain a voltage difference between the second node and the third node. The light emitting control component is electrically connected to a light emitting control signal terminal at a first terminal, is electrically connected to a first voltage signal terminal at a second terminal, and is electrically connected to a source of the dual-gate transistor at a third terminal. The light emitting control component is configured to transmit to the source of the dual-gate transistor a first voltage signal input from the first voltage signal terminal under the control of a light-emitting control signal input from the light-emitting control signal terminal. The voltage storage component is connected between the first voltage signal terminal and the first node. The driving transistor is a dual-gate transistor, the dual-gate transistor is electrically connected to the first node at a first gate, is electrically connected to the second node at a second gate, and is electrically connected to the third node at the drain. The switching control component is electrically connected to a fourth scan signal terminal at a first terminal, is electrically connected to the third node at a second terminal, is electrically connected to a fourth node at a third terminal, is electrically connected to a fifth scan signal terminal at a fourth terminal, is electrically connected to the second node at a fifth terminal, and is electrically connected to a signal output terminal of the external compensation component at a sixth terminal. The switching control component is configured to provide a potential of the third node to the fourth node under the control of a fourth scan signal input from the fourth scan signal terminal, and transmit to the second node a signal output by the signal output terminal of the external compensation component under the control of a fifth scan signal input from the fifth scan signal terminal. The external compensation component is electrically connected to the fourth node at a first signal input terminal, and is electrically connected to the reference signal terminal at a second signal input terminal. The external compensation component is configured to collect the voltage of the third node, and provide a compensation voltage to the second node under the control of the switching control component. The light-emitting diode is connected between the third node and a second voltage signal terminal.

DETAILED DESCRIPTION OF THE EMBODIMENTS

Figure 1:
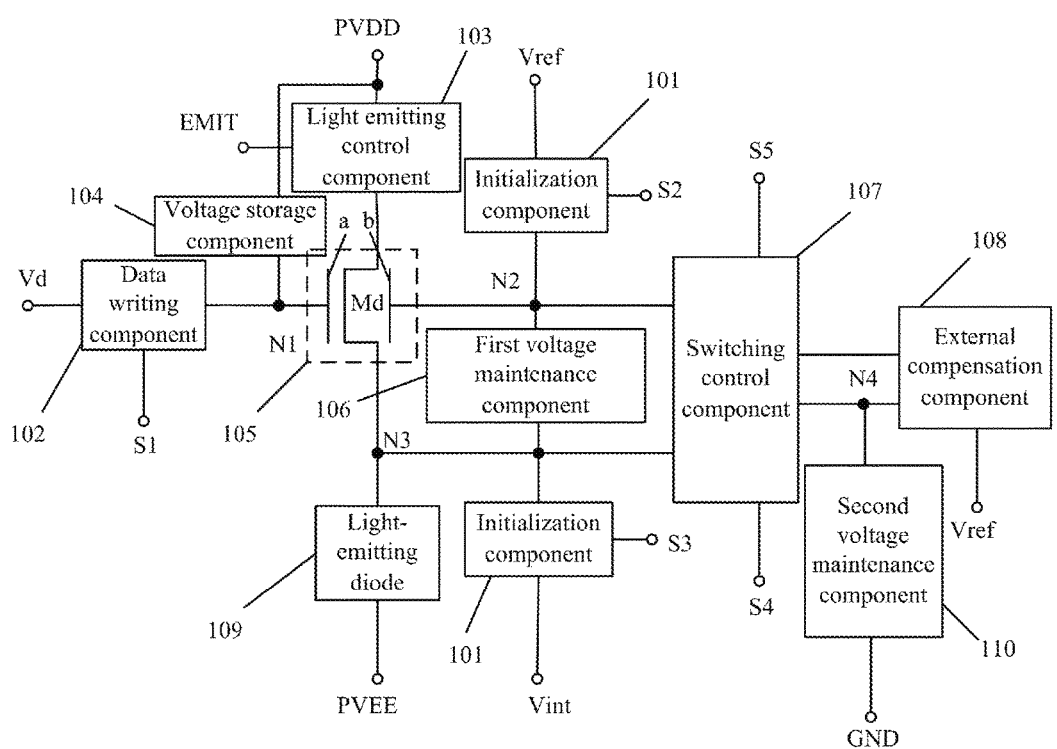
FIG. 1 is a first structural schematic diagram of a pixel circuit according to an embodiment of the present disclosure.

Some embodiments of a pixel circuit, a driving method thereof, an electroluminescent display panel and a display device according to embodiments of the present disclosure are described in detail below with reference to the accompanying drawings. It should be noted that the described embodiments are only a part but not all of the embodiments of the present disclosure. All other embodiments obtained by a person of ordinary skill in the art based on the embodiments of the present disclosure without creative efforts may fall within the protection scope of the present disclosure.

An embodiment of the present disclosure provides a pixel circuit including: an initialization component, a data writing component, a light emitting control component, a voltage storage component, a driving transistor, a first voltage maintenance component, a switching control component, an external compensation component and a light-emitting diode.

The driving transistor is a dual-gate transistor, and is configured to drive the light-emitting diode to emit light.

The data writing component is configured to transmit to a first gate of the dual-gate transistor a signal input from a data signal terminal.

The initialization component is configured to transmit to a second gate of the dual-gate transistor a reference signal input from a reference signal terminal, and transmit to a drain of the dual-gate transistor an initial signal input from an initial signal terminal.

The light emitting control component is configured to transmit to a source of the dual-gate transistor a first voltage signal input from a first voltage signal terminal.

The voltage storage component is configured to store a potential of a data signal input from the data signal terminal.

The first voltage maintenance component is configured to maintain a potential of the drain of the dual-gate transistor or maintain a voltage difference between the second gate and the drain of the dual-gate transistor.

The switching control component is configured to transmit the potential of the drain of the dual-gate transistor to the external compensation component, and transmit to the second gate of the dual-gate transistor a compensation voltage provided by the external compensation component.

The external compensation component is configured to provide a compensation voltage for the dual-gate transistor.

In the above pixel circuit according to the embodiment of the present disclosure, the second gate of the dual-gate transistor is electrically with the external compensation component through the switching control component, and moreover the external compensation component provides a compensation voltage to the second gate of the dual-gate transistor to adjust the threshold voltage of the dual-gate transistor, so that the current of the light-emitting diode which is emitting light is independent of the threshold voltage, avoiding the influence of the drift of the threshold voltage on the magnitude of the current and further avoiding the problem of display unevenness. Furthermore, through the effects of the external compensation component and the dual-gate transistor, the threshold voltage of the dual-gate transistor can be more approximate to a standard threshold voltage, thereby eliminating afterimages and improving the displaying quality.

In some implementations, since the switching control component is configured to transmit the potential of the drain of the dual-gate transistor to the external compensation component, and transmit to the second gate of the dual-gate transistor a compensation voltage according to the external compensation component, in the above pixel circuit according to the embodiment of the present disclosure, the external compensation component may be configured to collect the potential of the drain of the dual-gate transistor and provide a compensation voltage to the second gate of the dual-gate transistor, under the control of the switching control component.

In one embodiment, in order to achieve the function of the external compensation component, in the pixel circuit according to the embodiment of the present disclosure, the external compensation component may include: a processor.

A signal input terminal and a signal output terminal of the processor are both electrically connected to the switching control component.

The processor is configured to process the collected potential of the drain of the dual-gate transistor and then output it.

In one embodiment, in order to allow the processor to process the collected potential of the drain of the dual-gate transistor to compensate the threshold voltage of the dual-gate transistor, a corresponding processing circuit and buffer circuit can be arranged inside the processor. The processing circuit can determine a compensation voltage necessary for the dual-gate transistor according to the collected potential. The buffer circuit buffers the determined compensation voltage, and outputs the compensation voltage to the second gate of the dual-gate transistor under the control of the switching control component.

However, it is not enough to only use the processor to process the collected potential of the drain of the dual-gate transistor to provide the compensation voltage, and the processing capability of the processor is also limited. In order to effectively compensate the threshold voltage of the dual-gate transistor, in the above pixel circuit according to the embodiment, the external compensation component may further include: a first comparator arranged between the switching control component and the signal input terminal of the processor.

The first comparator has a first signal input terminal electrically connected to the switching control component, a second signal input terminal electrically connected to the reference signal terminal, and a signal output terminal electrically connected to the signal input terminal of the processor. The first comparator is configured to output a voltage difference between the first signal input terminal and the second signal input terminal.

The processor is further configured to output the voltage difference.

In one embodiment, the function of the first comparator is to process the potential of the drain of the dual-gate transistor and the reference signal potential input from the reference signal terminal to obtain a voltage difference there between, and then output the voltage difference to the processor. Therefore, a buffer circuit may be arranged in the processor to buffer the input signal, and then output the buffered voltage difference to the second gate of the dual-gate transistor under the control of the switching control component, to compensate the threshold voltage of the dual-gate transistor. Further, due to the function of the initialization component, the drain potential of the dual-gate transistor may be the difference between the reference signal potential and the threshold voltage when entering the first comparator. Therefore, by the function of the first comparator, the threshold voltage can be extracted and provided to the second gate of the dual-gate transistor through the functions of the processor and the switching control component, so as to compensate the threshold voltage of the dual-gate transistor. Of course, the drain potential of the dual-gate transistor is not limited to the difference between the reference signal potential and the threshold voltage, which is not limited herein.

Further, since the threshold voltage provided by the first comparator to the second gate of the dual-gate transistor is not necessarily a standard threshold voltage, the operating state of the dual-gate transistor is different from that at the factory; and after the dual-gate transistor works for a long time, its working performance inevitably may decrease to some degree, thus causing afterimages. Therefore, in order to maintain the working performance of the dual-gate transistor to be the performance at the factory after long-time use, in the above pixel circuit according to the embodiment of the present disclosure, the external compensation component may further includes: a second comparator arranged between the first comparator and the processor, and a memory electrically connected to the second comparator.

The memory is configured to store a standard threshold voltage.

The second comparator has a first signal input terminal electrically connected to the signal output terminal of the first comparator, a second signal input terminal electrically connected to the memory, and a signal output terminal electrically connected to the signal input terminal of the processor. The second comparator is configured to output a standard threshold voltage when the voltages of the first signal input terminal and the second signal input terminal are the same, and output a control voltage corresponding to a voltage difference when voltages of the first signal input terminal and the second signal input terminal are different.

The processor is further configured to output the received standard threshold voltage or output a corresponding compensation voltage according to the received control voltage.

In one embodiment, when the external compensation component includes the first comparator, the processor, the second comparator and the memory, the voltage difference between the first signal input terminal and the second signal input terminal of the first comparator is first output to the second comparator under the action of the first comparator; and then, under the action of the second comparator, it is determined whether the standard threshold voltage in the memory is the same as the voltage difference through comparison. If the standard threshold voltage in the memory is the same as the voltage difference, it means that the voltage difference is a standard threshold voltage, and in this case, the second comparator outputs the standard threshold voltage to the processor, and then through the processor's buffer processing, when the switching control component is turned on, the standard threshold voltage is transmitted to the second gate of the dual-gate transistor, so that the threshold voltage of the dual-gate transistor returns to the standard threshold voltage, thereby eliminating the problems of display unevenness and afterimages. Under the action of the second comparator, if the comparison result shows that the standard threshold voltage in the memory is different from the voltage difference, it means that the voltage difference is not a standard threshold voltage, and in this case, the second comparator may output to the processor a control voltage corresponding to the voltage difference. In this case, after receiving the control voltage, the processor performs operation processing to obtain a compensation voltage corresponding to the control voltage, and when the switching control component is turned on, the compensation voltage is transmitted to the second gate of the dual-gate transistor to correct and compensate the threshold voltage of the dual-gate transistor, so that the corrected threshold voltage of the dual-gate transistor is approximate to the standard threshold voltage, thereby eliminating the problems of display unevenness and afterimages.

In one embodiment, when the second comparator outputs a control voltage corresponding to the voltage difference, the processor parses the control voltage to determine whether the threshold voltage drifts positively or negatively, and then determines a proper compensation voltage according to the drift of the threshold voltage, and then transmits the compensation voltage to the second gate of the dual-gate transistor under the action of the switching control component, so that the threshold voltage of the dual-gate transistor is approximate to the standard threshold voltage so as to eliminate the problem of display unevenness and afterimages. Therefore, the values of the control voltage and the compensation voltage are not limited herein, and they need to be preset and adjusted according to actual conditions to achieve the purpose of eliminating display unevenness and afterimages.

In one implementation, in order to enable the switching control component to transmit a stable potential to the external compensation component so as to facilitate the operation of the external compensation component, the above pixel circuit according to an embodiment of the present disclosure may further includes: a second voltage maintenance component.

The second voltage maintenance component is configured to maintain the potential of the drain of the dual-gate transistor before the switching control component transmits the potential of the drain of the dual-gate transistor to the external compensation component.

It should be noted that, in the pixel circuit according to the embodiment of the present disclosure, each component is not limited to a configuration, could be in any configuration which can implement the functions of the foregoing components, and is not limited herein.

Based on the same inventive concept, an embodiment of the present disclosure provides a pixel circuit including: an initialization component 101, a data writing component 102, a light emitting control component 103, a voltage storage component 104 and a driving transistor 105, a first voltage maintenance component 106, a switching control component 107, an external compensation component 108 and a light-emitting diode 109, as shown in FIG. 1.

The data writing component 102 is electrically connected to a first scan signal terminal S1 at a first terminal, is electrically connected to a data signal terminal Vd at a second terminal, and is electrically connected to a first node N1 at a third terminal. The data writing component 102 is configured to transmit to the first node N1 a signal input from the data signal terminal Vd, under the control of the first scan signal input from the first scan signal terminal S1.

The initialization component 101 is electrically connected to a second scan signal terminal S2 at a first terminal, is electrically connected to a reference signal terminal Vref at a second terminal, is electrically connected to a second node N2 at a third terminal, is electrically connected to a third scan signal terminal S3 at a fourth terminal, is electrically connected to an initial signal terminal Vint at a fifth terminal, and is electrically connected to a third node N3 at a sixth terminal. The initialization component 101 is configured to transmit to the second node N2 a reference signal input from the reference signal terminal Vref under the control of a second scan signal input from the second scan signal terminal S2, and transmit to the third node N3 an initial signal input from the initial signal terminal Vint under the control of a third scan signal input from the third scan signal terminal S3.

The first voltage maintenance component 106 is electrically connected to the second node N2 at a first terminal, and is electrically connected to the third node N3 at a second terminal. The first voltage maintenance component 106 is configured to maintain a potential of the third node S3 under the control of a potential of the second node N2, and maintain a voltage difference between the second node N2 and the third node N3.

The light emitting control component 103 is electrically connected to a light emitting control signal terminal EMIT at a first terminal, is electrically connected to a first voltage signal terminal PVDD at a second terminal, and is electrically connected to a source of the dual-gate transistor at a third terminal. The light emitting control component 103 is configured to transmit to the source of the dual-gate transistor a first voltage signal input from the first voltage signal terminal PVDD under the control of a light-emitting control signal input from the light-emitting control signal terminal EMIT.

The voltage storage component 104 is connected between the first voltage signal terminal PVDD and the first node N1.

The driving transistor 105 is a dual-gate transistor Md, the dual-gate transistor Md is electrically connected to the first node N1 at a first gate a, is electrically connected to the second node N2 at a second gate b, and is electrically connected to the third node N3 at the drain.

The switching control component 107 is electrically connected to a fourth scan signal terminal S4 at a first terminal, is electrically connected to the third node N3 at a second terminal, is electrically connected to a fourth node N4 at a third terminal, is electrically connected to a fifth scan signal terminal S5 at a fourth terminal, is electrically connected to the second node N2 at a fifth terminal, and is electrically connected to a signal output terminal of the external compensation component 108 at a sixth terminal. The switching control component 107 is configured to provide a potential of the third node N3 to the fourth node N4 under the control of a fourth scan signal input from the fourth scan signal terminal S4, and transmit to the second node N2 a signal output by the signal output terminal of the external compensation component 108 under the control of a fifth scan signal input from the fifth scan signal terminal S5.

A first signal input terminal of the external compensation component 108 is electrically connected to the fourth node N4, and a second signal input terminal of the external compensation component is electrically connected to the reference signal terminal Vref. The external compensation component 108 is configured to collect the voltage of the third node N3 and provide a compensation voltage to the second node N2 under the control of the switching control component 107.

The light emitting diode 109 is connected between the third terminal N3 and a second voltage signal terminal PVEE.

In the above pixel circuit according to the embodiment of the present disclosure, the second gate b of the dual-gate transistor Md is electrically with the external compensation component 108 through the switching control component 107, and moreover the external compensation component 108 first collects the voltage of the third node N3 under the control of the switching control component 107 and then provides a compensation voltage to the second node N2 to adjust the voltage of the threshold voltage of the dual-gate transistor Md, so that the current of the light-emitting diode 109 which is emitting light is independent of the threshold voltage, avoiding the influence of the drift of the threshold voltage on the magnitude of the current and further avoiding the problem of display unevenness. Furthermore, through the functions of the external compensation component 108 and the dual-gate transistor Md, the threshold voltage of the dual-gate transistor Md can become more approximate to a standard threshold voltage, thereby eliminating afterimages and improving the displaying quality.

Figure 2:
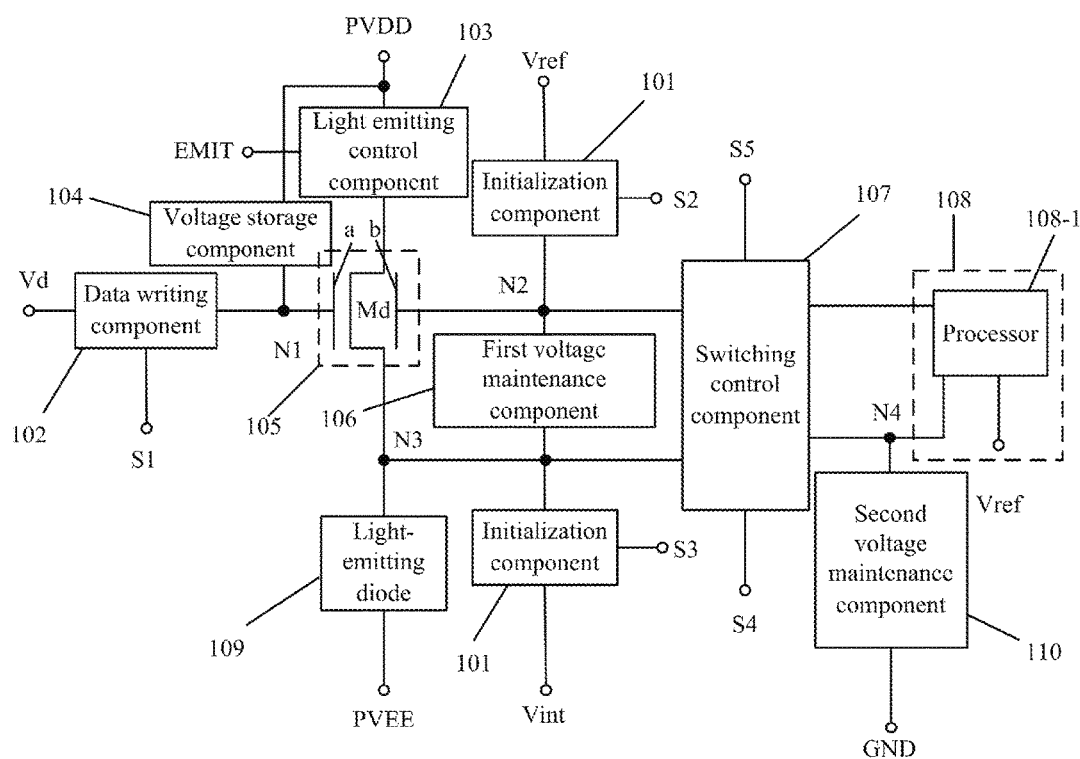
FIG. 2 is a second structural schematic diagram of a pixel circuit according to an embodiment of the present disclosure.
Figure 3:
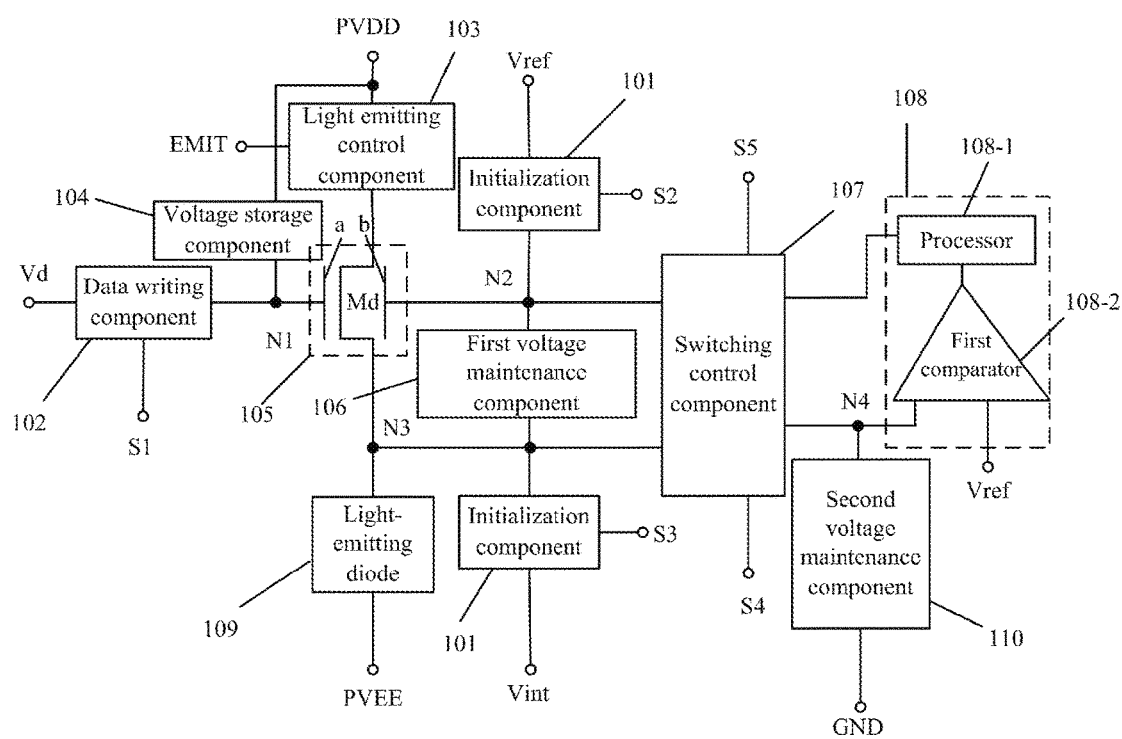
FIG. 3 is a third structural schematic diagram of a pixel circuit according to an embodiment of the present disclosure.
Figure 4:
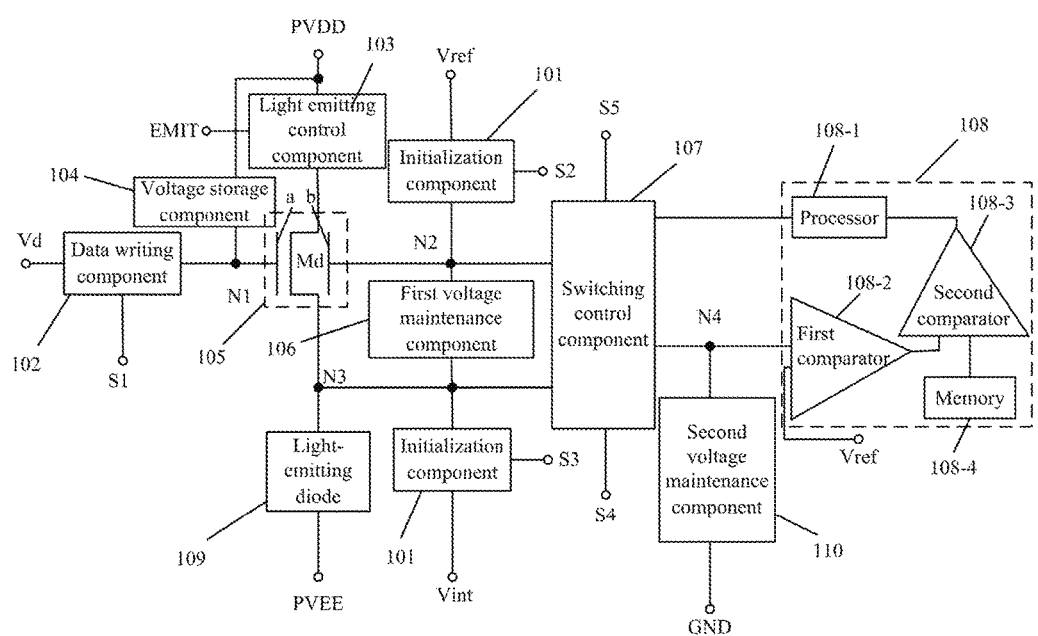
FIG. 4 is a fourth structural schematic diagram of a pixel circuit according to an embodiment of the present disclosure.

In one implementation, in order to fulfill the function of the external compensation component 108, in the above pixel circuit according to the embodiment of the present disclosure, the internal structure of the external compensation component 108 may have the following three types. In the first structure, the external compensation component 108 only includes a processor 108-1, as shown in FIG. 2. The processor 108-1 processes the collected potential of the third node N3 and then outputs a compensation voltage to compensate the threshold voltage of the dual-gate transistor Md. However, it is not enough to provide the compensation voltage by only processing the collected potential of the third node N3 by the processor 108-1, and the processing capability of the processor 108-1 is also limited. In order to effectively compensate the threshold voltage of the dual-gate transistor Md, the second structure is provided, that is, the external compensation component 108 is composed of a first comparator 108-2 and a processor 108-1, as shown in FIG. 3. The voltage difference between the first signal input terminal and the second signal input terminal is output to the processor 108-1 through the first comparator, then the processor 108-1 performs the buffering process, and the voltage difference is transmitted to the second node N2 when the switching control component 107 is turned on, thus compensating the threshold voltage of the dual-gate transistor Md. However, since the threshold voltage provided by the first comparator 108-2 to the second gate b of the dual-gate transistor Md is not necessarily the standard threshold voltage V0, the operating state of the dual-gate transistor is different from that at the factory, and after the dual-gate transistor works for a long time, its working performance inevitably may decrease to some degree, thus causing afterimages on the display screen. Therefore, in order to maintain the working performance of the dual-gate transistor to be the performance at the factory after long-time use, the third structure is provided, that is, the external compensation component 108 consists of a first comparator 108-2, a second comparator 108-3, a processor 108-1 and a memory 108-4, as shown in FIG. 4. Under the action of the first comparator 108-2 and the second comparator 108-3, a compensation voltage is provided for the second node N2 in a targeted manner to compensate the threshold voltage of the dual-gate transistor Md. Of course it is also possible to combine the above second structure with the third structure, that is, the pixel circuit includes both the second structure and the third structure, and the two structures can be switched for use. However, the two structures need to be switched by a preset program, which may complicate the control of the pixel circuit and increase the power consumption of an electroluminescent display panel. Therefore, taking the above three structures as an example, the above pixel circuit according to the embodiment of the present disclosure is described below in detail.

In one embodiment, in the case of the first structure, in the above pixel circuit according to the embodiment of the present disclosure, as shown in FIG. 2, the external compensation component 108 may include: a processor 108-1.

Signal input terminals of the processor 108-1 are electrically connected to the fourth node N4 and the reference signal terminal Vref respectively, and a signal output terminal of the processor 108-1 is electrically connected to the sixth terminal of the switching control component 107.

The processor 108-1 is configured to process the collected potential of the third node N3 and then output it.

In one embodiment, in order to allow the processor 108-1 to process the collected potential of the third node N3 to compensate the threshold voltage of the dual-gate transistor Md, a corresponding processing circuit and buffer circuit can be arranged inside the processor 108-1. The processing circuit can determine a compensation voltage necessary for the dual-gate transistor Md according to the collected potential of the third node N3 and the potential of the reference signal provided by the reference signal terminal Vref. The buffer circuit buffers the determined compensation voltage and outputs the compensation voltage to the second node N2 under the control of the switching control component 107. Of course, the processing circuit can also determine the necessary compensation voltage of the dual-gate transistor Md only according to the collected potential of the third node N3, which is not limited herein.

In one embodiment, in the case of the second structure, in the above pixel circuit according to the embodiment of the present disclosure, as shown in FIG. 3, the external compensation component 108 may further include: a first comparator 108-2 arranged between the fourth node N4 and a signal input terminal of the processor 108-1.

The first comparator 108-2 has a first signal input terminal electrically connected to the fourth node N4, a second signal input terminal electrically connected to the reference signal terminal Vref, and a signal output terminal electrically connected to the signal input terminal of the processor 108-1. The first comparator 108-2 is configured to output a voltage difference between the first signal input terminal and the second signal input terminal.

The processor 108-1 is further configured to output the voltage difference.

In one embodiment, suppose that the potential of the fourth node N4 is Vref−Vth, since the second signal input terminal of the first comparator 108-2 inputs the reference signal, the first comparator 108-2 processes Vref−Vth input from the first signal input terminal and the reference signal input from the second signal terminal to extract the threshold voltage Vth. and outputs the threshold voltage Vth to the processor 108-1. Of course, the potential of the fourth node N4 is not limited to Vref−Vth which is merely described as an example herein. The first comparator 108-2 extracts the voltage difference between the first signal input terminal and the second signal input terminal according to the signal input from the first signal input terminal and the reference signal input from the second signal input terminal, and outputs the voltage difference to the processor 108-1 so that the processor 108-1 performs further processing. Therefore, the voltage difference between the first signal input terminal and the second signal input terminal is not limited herein.

In one embodiment, in the case of the third structure, in the above pixel circuit according to the embodiment of the present disclosure, as shown in FIG. 4, the external compensation component 108 may further include: a second comparator 108-3 arranged between the first comparator 108-2 and the processor 108-1, and a memory 108-4 electrically connected to the second comparator 108-3.

The memory 108-4 is configured to store a standard threshold voltage V0.

The second comparator 108-3 has a first signal input terminal electrically connected to the signal output terminal of the first comparator 108-2, a second signal input terminal electrically connected to the memory 108-4, and a signal output terminal electrically connected to the signal input terminal of the processor 108-1. The second comparator 108-3 is configured to output a standard threshold voltage V0 when the voltages of the first signal input terminal and the second signal input terminal are the same, and output a control voltage Vc corresponding to a voltage difference when voltages of the first signal input terminal and the second signal input terminal are different.

The processor 108-1 is further configured to output the received standard threshold voltage V0 or output a corresponding compensation voltage Vs according to the received control voltage Vc.

In one embodiment, when the external compensation component 108 includes the first comparator 108-2, the processor 108-1, the second comparator 108-3 and the memory 108-4, the voltage difference between the first signal input terminal and the second signal input terminal of the first comparator 108-2 is first output to the second comparator 108-3 under the action of the first comparator 108-2. Then, under the action of the second comparator 108-3, it is determined whether the standard threshold voltage V0 in the memory 108-4 is the same as the voltage difference through comparison. If the standard threshold voltage V0 in the memory is the same as the voltage difference, it means that the voltage difference is the standard threshold voltage V0, and in this case, the second comparator 108-3 outputs the standard threshold voltage V0 to the processor 108-1, and then through the buffer processing of the processor 108-1, the standard threshold voltage V0 is transmitted to the second node N2 when the switching control component 107 is turned on, so that the threshold voltage of the dual-gate transistor Md returns to the standard threshold voltage V0, thereby eliminating the problems of display unevenness and afterimages. Under the action of the second comparator 108-3, if the comparison result shows that the standard threshold voltage V0 in the memory 108-4 is different from the voltage difference, it means that the voltage difference is not the standard threshold voltage V0, and in this case, the second comparator 108-3 may output to the processor 108-1 a control voltage Vc corresponding to the voltage difference. In this case, after receiving the control voltage Vc, the processor 108-1 performs operation processing to obtain a compensation voltage Vs corresponding to the control voltage Vc, and when the switching control component 107 is turned on, the compensation voltage Vs is transmitted to the second node N2 to correct and compensate the threshold voltage of the dual-gate transistor, so that the corrected threshold voltage of the dual-gate transistor Md is approximate to the standard threshold voltage V0, thereby eliminating the problems of display unevenness and afterimages.

In one embodiment, when the second comparator 108-3 outputs a control voltage Vc corresponding to the voltage difference, the processor 108-1 parses the control voltage Vc to determine whether the threshold voltage Vth drifts positively or negatively, and then determines a proper compensation voltage Vs according to the drift of the threshold voltage Vth, and then transmits the compensation voltage Vs to the second node N2 under the action of the switching control component 107, so that the threshold voltage of the dual-gate transistor is approximate to the standard threshold voltage so as to eliminate the problem of display unevenness and afterimages. Therefore, the values of the control voltage Vc and the compensation voltage Vs are not limited herein, and they need to be preset and adjusted according to actual conditions to achieve the purpose of eliminating display unevenness and afterimages.

In one embodiment, in the above pixel circuit according to the embodiment of the present disclosure, a corresponding table of the standard threshold voltages V0 of the dual-gate transistors Md in the pixel circuits of various pixel units needs to be stored in advance in the memory 108-4, or is automatically detected and written in at the time of first power-on, to store the standard threshold voltages V0.

Figure 5:
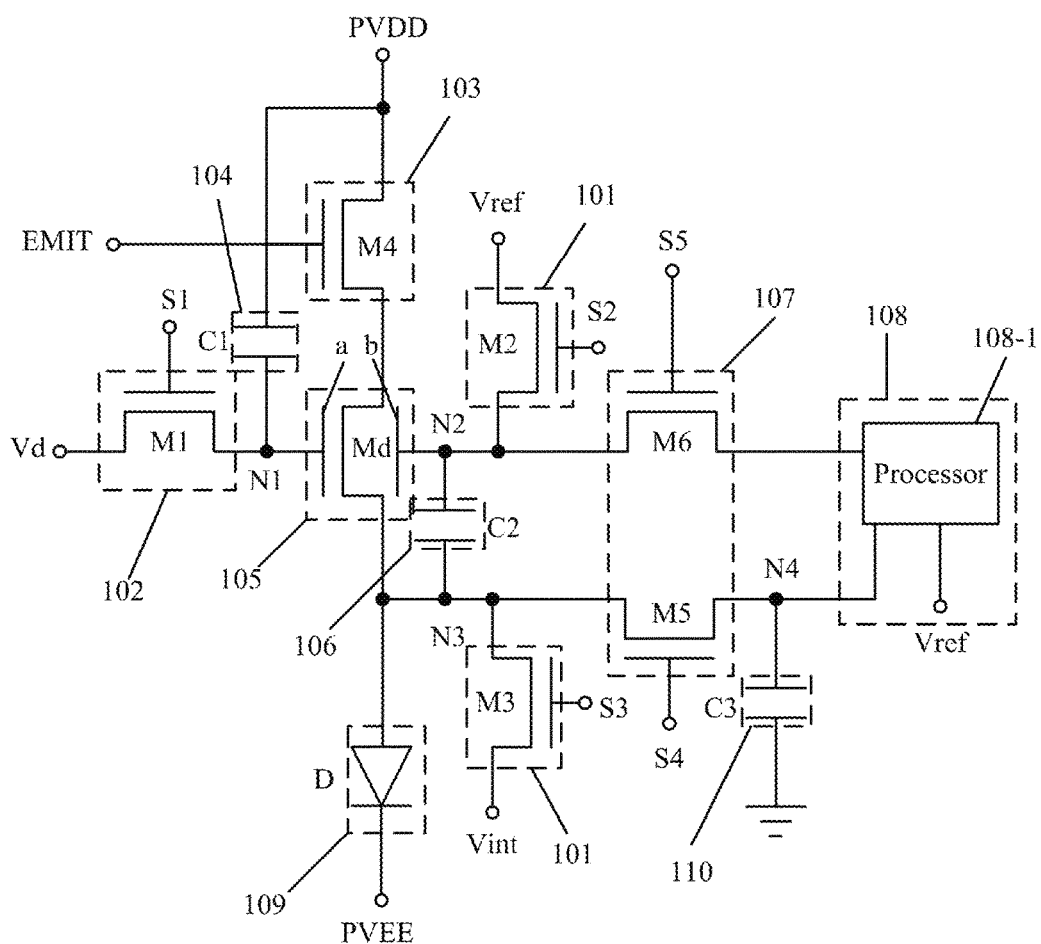
FIG. 5 is a fifth structural schematic diagram of a pixel circuit according to an embodiment of the present disclosure.
Figure 6:
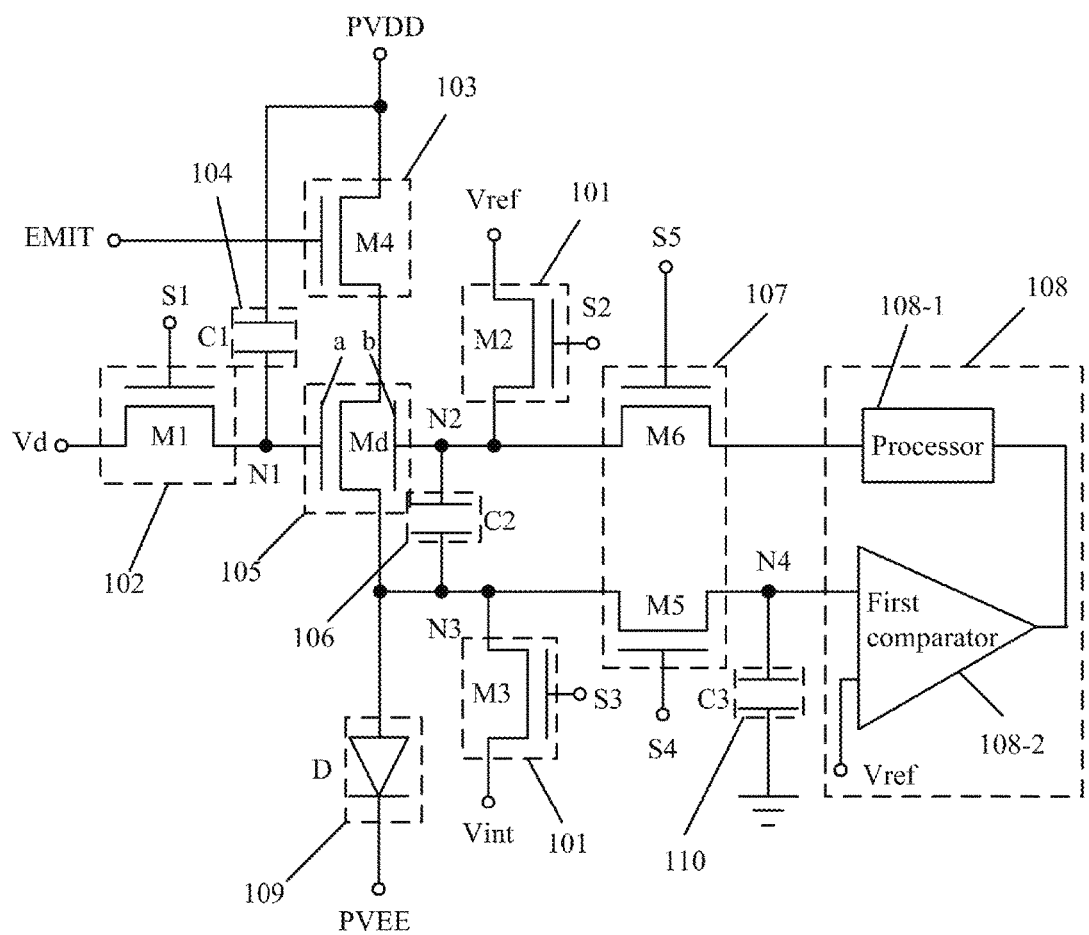
FIG. 6 is a sixth structural schematic diagram of a pixel circuit according to an embodiment of the present disclosure.
Figure 7:
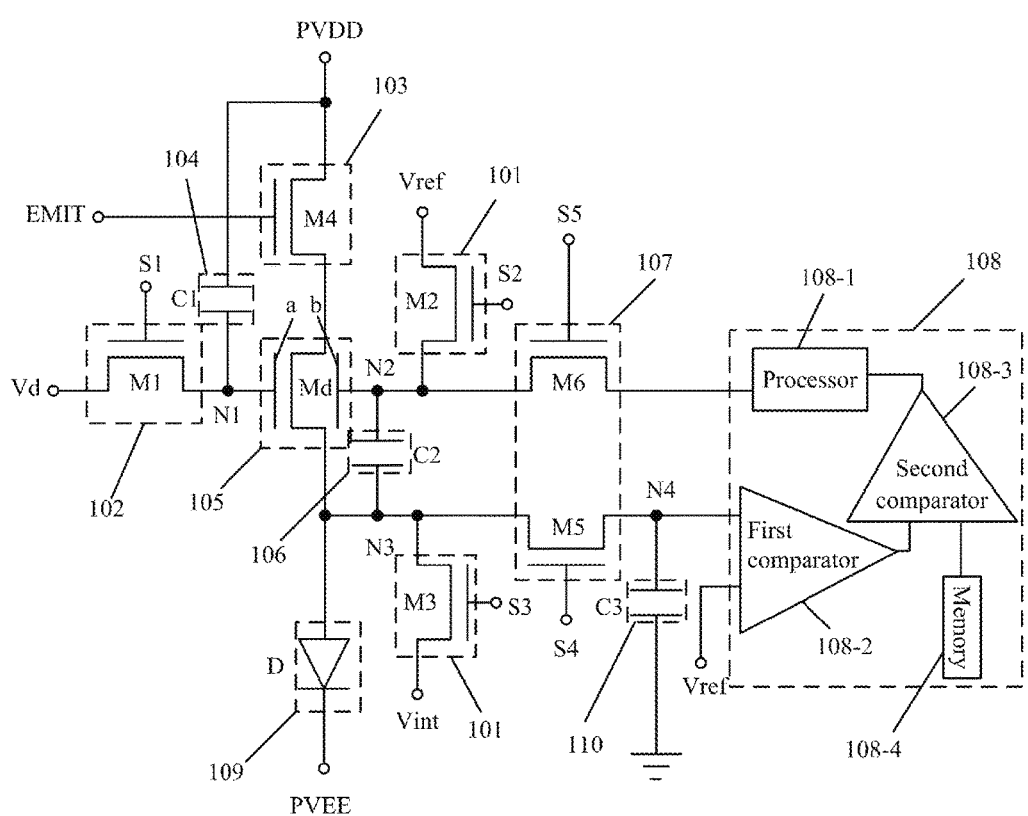
FIG. 7 is a seven structural schematic diagram of a pixel circuit according to an embodiment of the present disclosure.

In one implementation, in order to fulfill the function of the data writing component 102, a corresponding signal is provided to the first node N1. In the pixel circuit according to the embodiment of the present disclosure, as shown in FIG. 5 to FIG. 7, where FIG. 5 is a structural schematic diagram of a specific pixel circuit corresponding to FIG. 2, FIG. 6 is a structural schematic diagram of a specific pixel circuit corresponding to FIG. 3, FIG. 7 is a structural schematic diagram of a specific pixel circuit corresponding to FIG. 4, the data writing component 102 may include a first switching transistor M1.

A gate of the first switching transistor M1 is electrically connected to the first scan signal terminal S1, a source of the first switching transistor M1 is electrically connected to the data signal terminal Vd, and a drain of the first switching transistor M1 is electrically connected to the first node N1.

In one embodiment, the first switching transistor M1 transmits the signal input from the data signal terminal Vd to the first node N1 under the control of the first scan signal input from the first scan signal terminal S1.

In one embodiment, since the first node N1 is electrically connected to the first gate a of the dual-gate transistor Md, the first gate a (i.e., the first node N1) needs to be initialized in the initialization phase. Therefore, at this time, the signal input from the data signal terminal Vd is a reference signal Vref. In the data writing phase, since data needs to be written into the first gate a of the dual-gate transistor Md, the signal inputted by the data signal terminal Vd is the data signal Vdata at this time. Therefore, in the above pixel circuit according to the embodiment of the present disclosure, the signal input from the data signal terminal Vd may be the reference signal Vref and may also be the data signal Vdata. Different signals need to be input in different phases to meet the normal operation of the pixel circuit.

In one embodiment, in the pixel circuit according to the embodiment of the present disclosure, the first switching transistor M1 may be an N-type transistor, and when a first scan signal input from the first scan signal terminal S1 is a high-level signal, the first switching transistor M1 is turned on. The first switching transistor M1 may also be a P-type transistor, and when the first scan signal input from the first scan signal terminal S is a low-level signal, the first switching transistor M is turned on.

The above description is set forth as an example merely for describing the structure of the data writing component 102. In one implementation, the structure of the data writing component 102 is not limited to the above structure according to the embodiment and may also be other structures which will not be detailed here.

In one implementation, in order to fulfill the function of the initialization component 101 to initialize the second node N2 and the third node N3, in the above pixel circuit according to the embodiment of the present disclosure, as shown in FIG. 5 to FIG. 7, the initialization component 101 may include: a second switching transistor M2 and a third switching transistor M3.

A gate of the second switching transistor M2 is electrically connected to the second scan signal terminal S2, a source of the second switching transistor M2 is electrically connected to the reference signal terminal Vref, and a drain of the second switching transistor M2 is electrically connected to the second node N2.

A gate of the third switching transistor M3 is electrically connected to the third scan signal terminal S3, a source of the third switching transistor M3 is electrically connected to the initial signal terminal Vint. and a drain of the third switching transistor M3 is electrically connected to the third node N3.

In one embodiment, the second switching transistor M2 transmits to the second node N2 the reference signal input from the reference signal terminal Vref under the control of the second scan signal input from the second scan signal terminal S2. The third switching transistor M3 transmits to the third node N3 the initial signal input from the initial signal terminal Vint under the control of the third scan signal input from the third scan signal terminal S3.

In one embodiment, both the second switching transistor M2 and the third switching transistor M3 may be N-type transistors; then the second switching transistor M2 is turned on when the second scan signal input from the second scan signal terminal S2 is a high-level signal, and the third switching transistor M3 is turned on when the third scan signal input from the third scan signal terminal S3 is a high-level signal. Both the second switching transistor M2 and the third switching transistor M3 may also be P-type transistors then the second switching transistor M2 is turned on when the second scan signal input from the second scan signal terminal S2 is a low-level signal, and the third switching transistor M3 is turned on when the third scan signal input from the third scan signal terminal S3 is a low-level signal.

The above description is set forth as an example merely for describing the structure of the initialization component 101. In one implementation, the structure of the initialization component 101 is not limited to the above structure according to the embodiment and may also be other structures which will not be detailed here.

In one implementation, in order to fulfill the function of the light emitting control component 103 to contribute to the light emission of the light-emitting diode 109, in the above pixel circuit according to the embodiment of the present disclosure, as shown in FIG. 5 to FIG. 7, the light emitting control component 103 may include: a fourth switching transistor M4.

A gate of the fourth switching transistor M4 is electrically connected to the light emitting control signal terminal EMIT, a source of the fourth switching transistor M4 is electrically connected to the first voltage signal terminal PVDD, and a drain of the fourth switching transistor M4 is electrically connected to the source of the dual-gate transistor Md.

In one embodiment, the fourth switching transistor M4 transmits to the source of the dual-gate transistor Md the first voltage signal input from the first voltage signal terminal PVDD under the control of the light emitting control signal input from the light emitting control signal terminal EMIT.

In one embodiment, the fourth switching transistor M4 may be an N-type transistor, and when the light emitting control signal input from the light emitting control signal terminal EMIT is a high-level signal, the fourth switching transistor M4 is turned on. The fourth switching transistor M4 may also be a P-type transistor, and when the light emitting control signal input from the light emitting control signal terminal EMIT is a low-level signal, the fourth switching transistor M4 is turned on.

The above description is set forth as an example merely for describing the structure of the light emitting control component 103. In one implementation, the structure of the light emitting control component 103 is not limited to the above structure according to the embodiment and may also be other structures which will not be detailed here.

In one implementation, in order to fulfill the function of the switching control component 107 to assist the external compensation component 108 to collect the voltage of the third node N3 and provide a compensation voltage to the second node N2, in the above pixel circuit according to the embodiment of the present disclosure, as shown in FIG. 5 to FIG. 7, the switching control component 107 may include: a fifth switching transistor M5 and a sixth switching transistor M6.

A gate of the fifth switching transistor M5 is electrically connected to the fourth scan signal terminal S4, a source of the fifth switching transistor M5 is electrically connected to the third node N3, and a drain of the fifth switching transistor M5 is electrically connected to the fourth node N4.

A gate of the sixth switching transistor M6 is electrically connected to the fifth scan signal terminal S5, a source of the sixth switching transistor M6 is electrically connected to the signal output terminal of the external compensation component 108, and a drain of the sixth switching transistor M6 is electrically connected to the second node N2.

In one embodiment, the fifth switching transistor M5 provides the potential of the third node N3 to the fourth node N4 under the control of the fourth scan signal input from the fourth scan signal terminal S4. The sixth switching transistor M6 provides the second node N2 with a signal output from the external compensation component 108 under the control of the fifth scan signal input from the fifth scan signal terminal S5.

In one embodiment, both the fifth switching transistor M5 and the sixth switching transistor M6 may be N-type transistors; the fifth switching transistor M5 is turned on when the fourth scan signal input from the fourth scan signal terminal S4 is a high-level signal, and the sixth switching transistor M6 is turned on when the fifth scan signal input from the fifth scan signal terminal S5 is a high-level signal. Both the fifth switching transistor M5 and the sixth switching transistor M6 may be P-type transistors; the fifth switching transistor M5 is turned on when the fourth scan signal input from the fourth scan signal terminal S4 is a low-level signal, and when the fifth scan signal input from the fifth scan signal terminal S5 is a low level signal, the sixth switching transistor M6 is turned on.

The above description is set forth as an example merely for describing the structure of the switching control component 107. In one implementation, the structure of the switching control component 107 is not limited to the above structure according to the embodiment and may also be other structures which will not be detailed here.

In one implementation, the dual-gate transistor Md and various switching transistors mentioned in the above pixel circuit according to the embodiment of the present disclosure may all adopt a P-type transistor design, or as shown in FIG. 5 to FIG. 7, the dual-gate transistors Md and various switching transistors may all adopt an N-type transistor design, which can simplify the fabricating process of the pixel circuit.

Of course, various switching transistors and the dual-gate transistors involved in the above pixel circuit according to the embodiment of the present disclosure may be thin film transistors (TFT) and may also be metal oxide semiconductors (MOS). The source and the drain of each of the above-mentioned switching transistors and dual-gate transistors are fabricated in the same process and are interchangeable in name, and may be changed in name according to the direction of the voltage.

Figure 8:
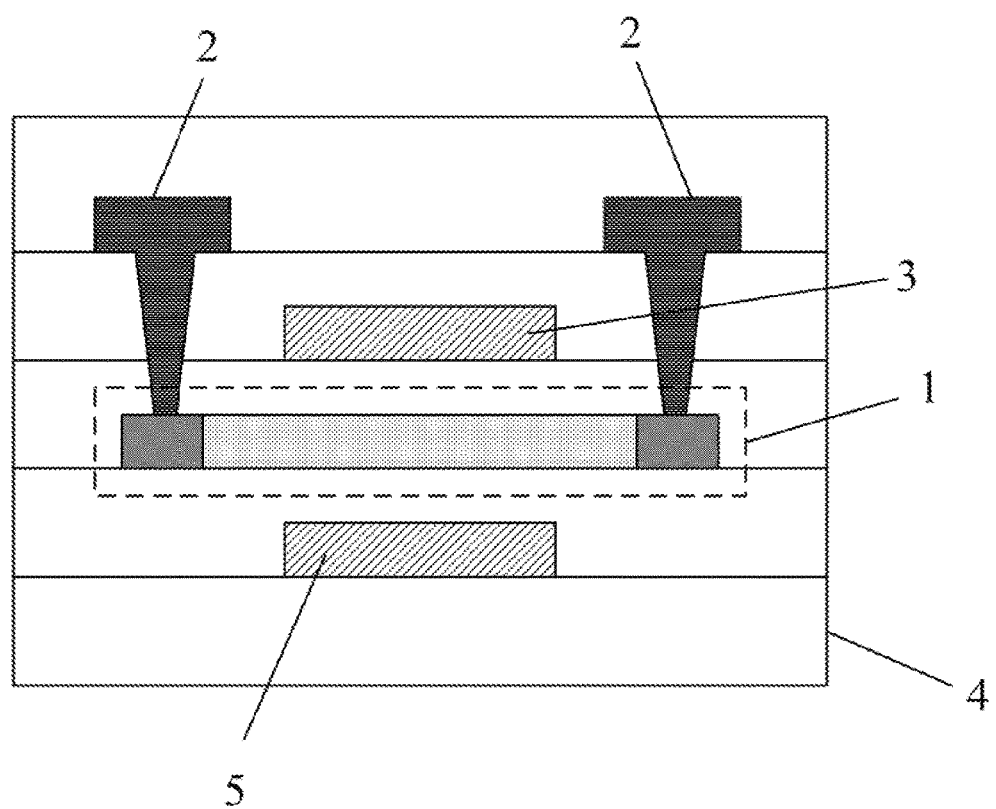
FIG. 8 is a sectional view of a dual-gate transistor according to an embodiment of the present disclosure.

In one implementation, in the above pixel circuit according to the embodiment of the present disclosure, as shown in FIG. 1 to FIG. 7, the driving transistor 105 is a dual-gate transistor Md, i.e., the dual-gate transistor Md has two gates, including a first gate a and a second gate b. In the sectional view of the dual-gate transistor shown in FIG. 8, the first gate a may be a top gate 3 disposed between an active layer 1 and a source/drain electrode 2, the second gate b may be a bottom gate 5 disposed between a substrate 4 and the active layer 1. Of course, the first gate a may also be a bottom gate 5 disposed between the substrate 4 and the active layer 1, and at this time the second gate b is a top gate 3 disposed between the active layer 1 and the source/drain electrode 2, which is not limited herein.

In one implementation, in order to fulfill the function of the voltage storage component 104 to store data signals, in the above pixel circuit according to the embodiment of the present disclosure, as shown in FIG. 5 to FIG. 7, the voltage storage component 104 may include: a first capacitor C1.

The first capacitor C1 is connected between the first voltage signal terminal PVDD and the first node N1.

In one implementation, in order to fulfill the function of the first voltage maintenance component 106 to maintain the potential of the third node N3 during the data writing phase, and maintain the voltage difference between the second node N2 and the third node N3 during the light emitting phase, in the above pixel circuit according to the embodiment of the present disclosure, as shown in FIG. 5 to FIG. 7, the first voltage maintenance component 106 may include: a second capacitor C2.

The second capacitor C2 is connected between the second node N2 and the third node N3.

In one implementation, in order to input a stable potential for the first signal input terminal of the first comparator 108-2, the above pixel circuit according to the embodiment of the present disclosure may further include a second voltage maintenance component 110, as shown in FIG. 1 to FIG. 4.

The first terminal of the second voltage maintenance component 110 is electrically connected to the fourth node N4, and the second terminal of the second voltage maintenance component 110 is electrically connected to a ground signal terminal GND. The second voltage maintenance component 110 is configured to maintain the potential of the fourth node N4 under the control of a ground signal input from the ground signal terminal GND.

In one embodiment, in order to fulfill the function of the second voltage maintenance component 110 to control the potential of the fourth node N4, in the above pixel circuit according to the embodiment of the present disclosure, the second voltage maintenance component 110 includes a third capacitor C3, as shown in FIG. 5 to FIG. 7.

The third capacitor C3 is connected between the fourth node N4 and the ground signal terminal GND.

Further, the ground signal terminal GND may be directly grounded, of course, it may also be a signal terminal that provides a ground signal, which is not limited herein.

The working process of the above pixel circuit according to the embodiment of the present disclosure will be described in detail below with reference to specific embodiments.

In one embodiment, in the above pixel circuit according to the embodiment of the present disclosure, not only the external compensation component is included, but also the driving transistor is modified into a dual-gate transistor so as to compensate for the threshold voltage and solve the problems of uneven display brightness and afterimages caused by the drift of the threshold voltage. Therefore, in the implementation, there may be several embodiments as follows. In the first embodiment, the threshold voltage is compensated only by means of internal compensation. In the second embodiment, the threshold voltage is compensated only by means of external compensation. Since both the first embodiment and the second embodiment are both to compensate the threshold voltage under a certain bias voltage, the ability to eliminate afterimages and solve the uneven display brightness is limited. Therefore, the third embodiment and the fourth embodiment are provided where internal compensation and external compensation are combined to compensate the threshold voltage so that the threshold voltage of the driving transistor is adjusted to a standard threshold voltage so as to effectively solve the problems of uneven display brightness and afterimages and improve the display quality.

Figure 9:
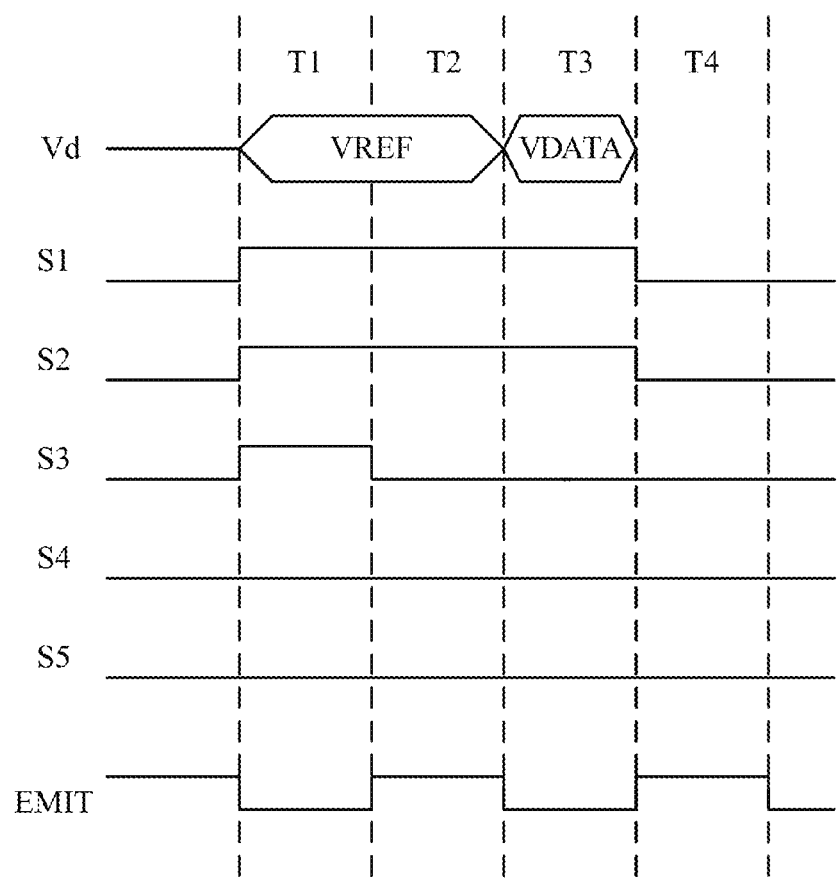
FIG. 9 is an first input-output timing diagram of a pixel circuit according to an embodiment of the present disclosure.

In one embodiment, in the first embodiment, the operating progress of the pixel circuit according to the embodiment of the present disclosure is described by taking the above pixel circuit shown in FIG. 6 as an example and with reference to the input-output timing chart shown in FIG. 9.

In phase T1 which is an initialization phase, this phase includes initialization of the first node N1, initialization of the second node N2, and initialization of the third node N3, where S1=1, S2=1, S3=1, S4=0, S5=0, EMIT=0, Vd=Vref.

Since S1=1, S2=1 and S3=1, the first switching transistor M1, the second switching transistor M2 and the third switching transistor M3 are all turned on. The first switching transistor M1 transmits to the first node N1 a reference signal Vref input from the data signal terminal Vd, the second switching transistor M2 transmits to the second node N2 a reference signal input from the reference signal terminal Vref, and the third switching transistor M3 transmits to the third node N3 an initial signal input from the initial signal terminal Vint, thus completing initialization of the first gate a and the second gate b of the dual-gate transistor Md and the initialization of the drain. Therefore, in this phase, the potential of the first node N1 is Vref, the potential of the second node N2 is Vref, the potential of the third node N3 is Vint. To be noted, it is preset that Vref−Vint>Vth, that is, the voltage difference between the first node N1 and the third node N3 is greater than the threshold voltage Vth of the dual-gate transistor Md or the voltage difference between the second node N2 and the third node N3 is greater than the threshold voltage Vth of the dual-gate transistor Md.

In phase T2 which is a threshold voltage extraction phase, S1=1, S2=1, S3=0, S4=0, S5=0, EMIT=1 and Vd=Vref.

Since S1=1 and S2=1, the first switching transistor M1 and the second switching transistor M2 are turned on, so that the potentials of the first node N1 and the second node N2 are maintained as the potential of the reference signal Vref. Since EMIT=1 and Vref−Vint>Vth, when the fourth switching transistor M4 is turned on, a current flows through the dual-gate transistor Md, so that the first gate a and the drain of the dual-gate transistor Md are turned on, or the second gate b and the drain are turned on. Since S3=0, the third switching transistor M3 is turned off, so that the potential of the third node N3 becomes Vref−Vth To make the light-emitting diode D emit light, the potential of the third node N3 could be at least PVEE+Voled. However, since it is preset that Vref−Vth<PVEE+Voled, the light-emitting diode D does not emit light in this phase.

In phase T3 which is a data writing phase, S1=1, S2=1, S3=0, S4=0, S5=0, EMIT=0 and Vd=Vdata.

Since S1=1 and S2=1, the first switching transistor M1 and the second switching transistor M2 are turned on, so that the potential of the first node N1 is the potential of a data signal Vdata and the data signal Vdata is stored in the first capacitor C1, and the potential of the second node N2 is maintained as the potential of the reference signal Vref. Since the third switching transistor M3 is turned off, the potential of the third node N3 is maintained at Vref−Vth under the action of the second capacitor C2, and the light-emitting diode D does not emit light in this phase.

In phase T4 which is a light emitting phase, S1=0, S2=0, S3=0, S4=0, S5=0 and EMIT=1.

Since S1=0, S2=0, and S3=0, the first switching transistor M1, the second switching transistor M2 and the third switching transistor M3 are all turned off. Since the light emitting control signal input from the light emitting control signal terminal EMIT is a high-level signal, the fourth switching transistor M4 is turned on, and under the action of the data signal Vdata of the first node N1, the dual-gate transistor Md is turned on. In addition, when the light-emitting diode D emits light, the potential of the third node N3 needs to be at least PVEE+Voled. Therefore, when N3=PVEE+Voled, it can be known that the potential variation ΔV of the third node N3 is equal to the potential in the phase T4 subtracted by the potential in phase T3, that is, ΔV=PVEE+Voled−(Vref−Vth)=PVEE+Voled−Vref+Vth. Due to the action of the second capacitor C2, the potential of the second node N2 changes from the potential of the reference signal Vref in the phase T3 to Vref+ΔV, that is, N2=Vref+ΔV=PVEE+Voled+Vth. Therefore, Vgs of the dual-gate transistor Md equals to N1+N2−N3=Vdata+(PVEE+Voled+Vth)−(PVEE+Voled)=Vdata+Vth, I=K(Vgs−Vth)$^2$=K(Vdata), that is, the driving current of the dual-gate transistor Md is only related to the potential of the data signal Vdata but not related to the threshold voltage Vth so that the drift of the threshold voltage Vth does not affect the magnitude of the driving current, thereby ensuring the evenness of display brightness.

It should be noted that in the above four phases, that is, in T1 to T4, since the fourth scan signal terminal S4 and the fifth scan signal terminal S5 are always at a low level so that the fifth switching transistor M5 and the sixth switching transistor M6 are always in an off state, the external compensation component 108 does not work all the time. Therefore, in this embodiment, only under the action of internal compensation and the dual-gate transistor Md, the problems of display brightness unevenness and afterimages caused by the drift of the threshold voltage are solved.

Figure 10:
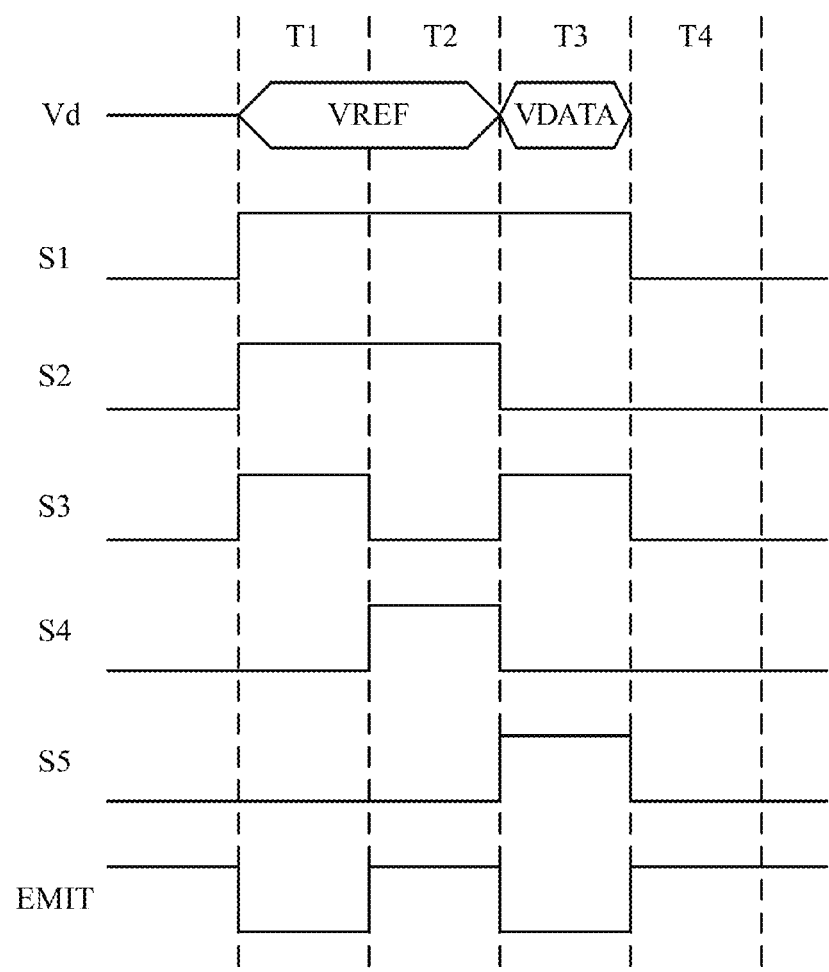
FIG. 10 is an second input-output timing diagram of a pixel circuit according to an embodiment of the present disclosure.

In one embodiment, in the second embodiment, the operating progress of the pixel circuit according to the embodiment of the present disclosure is described by taking the above pixel circuit shown in FIG. 6 as an example and with reference to the input-output timing chart shown in FIG. 10.

In phase T1 which is an initialization phase, this phase includes initialization of the first node N1, initialization of the second node N2, and initialization of the third node N3, where S1=1, S2=1, S3=1, S4=0, S5=0, EMIT=0, Vd=Vref.

Since S1=1, S2=1 and S3=1, the first switching transistor M1, the second switching transistor M2 and the third switching transistor M3 are all turned on. The first switching transistor M1 transmits to the first node N1 a reference signal Vref input from the data signal terminal Vd, the second switching transistor M2 transmits to the second node N2 a reference signal input from the reference signal terminal Vref, and the third switching transistor M3 transmits to the third node N3 an initial signal input from the initial signal terminal Vint, thus completing initialization of the first gate a and the second gate b of the dual-gate transistor Md and the initialization of the drain. Therefore, in this phase, the potential of the first node N1 is Vref, the potential of the second node N2 is Vref, the potential of the third node N3 is Vint. To be noted, it is preset that Vref−Vint>Vth, that is, the voltage difference between the first node N1 and the third node N3 is greater than the threshold voltage Vth of the dual-gate transistor Md, or the voltage difference between the second node N2 and the third node N3 is greater than the threshold voltage Vth of the dual-gate transistor Md.

In phase T2 which is a threshold voltage extraction phase, S1=1, S2=1, S3=0, S4=1, S5=0, EMIT=1 and Vd=Vref.

Since S1=1 and S2=1, the first switching transistor M and the second switching transistor M2 are turned on, so that the potentials of the first node N1 and the second node N2 are maintained as the potential of the reference signal Vref. Since EMIT=1 and Vref−Vint>Vth, when the fourth switching transistor M4 is turned on, a current flows through the dual-gate transistor Md, so that the first gate a and the drain of the dual-gate transistor Md are turned on, or the second gate b and the drain are turned on. Since S3=0, the third switching transistor M3 is turned off, so that the potential of the third node N3 becomes Vref−Vth. To make the light-emitting diode D emit light, the potential of the third node N3 could be at least PVEE+Voled. However, since it is preset that Vref−Vth<PVEE+Voled, the light-emitting diode D does not emit light in this phase. In addition, since S4=1, the fifth switching transistor M5 is turned on, the potential of the third node N3 is provided to the fourth node N4, so that the potential of the fourth node N4 is Vref−Vth, and under the action of the third capacitor C3, the potential of the fourth node N4 can be maintained at Vref−Vth. Through the function of the first comparator 108-2, the threshold voltage Vth at this time is acquired and output to the processor 108-1.

In phase T3 which is a data writing phase, S1=1, S2=0, S3=1, S4=0, S5=1, EMIT=0 and Vd=Vdata.

Since S1=1 and S3=1, the first switching transistor M1 and the third switching transistor M3 are turned on, so that the potential of the first node N1 is the potential of the data signal Vdata, and the data signal Vdata is stored in the first capacitor C1, and the potential of the third node N3 is the potential of the initial signal Vint, so as to initialize the anode (i.e., the third node N3) of the light-emitting diode D. Since S5=1, the sixth switching transistor M6 is turned on, the threshold voltage Vth buffered in the processor 108-1 is transmitted to the second node N2 so that N2=Vth.

In phase T4 which is a light emitting phase, S1=0, S2=0, S3=0, S4=0, S5=0 and EMIT=1.

Since S1=0, S2=0, and S3=0, the first switching transistor M1, the second switching transistor M2 and the third switching transistor M3 are all turned off. Since the light emitting control signal input from the light emitting control signal terminal EMIT is a high-level signal, the fourth switching transistor M4 is turned on, and under the action of the data signal Vdata of the first node N1, the dual-gate transistor Md is turned on. In addition, when the light-emitting diode D emits light, the potential of the third node N3 needs to be at least PVEE+Voled. Therefore, when N3=PVEE+Voled, it can be known that the potential variation ΔV of the third node N3 is equal to the potential in the phase T4 subtracted by the potential in phase T3, that is, ΔV=PVEE+Voled−Vint. Due to the action of the second capacitor C2, the potential of the second node N2 changes from the threshold voltage Vth in the phase T3 to Vth+ΔV, that is, N2=Vth+ΔV=PVEE+Voled−Vint+Vth. Therefore, Vgs of the dual-gate transistor Md equals to N1+N2−N3=Vdata+(PVEE+Voled−Vint+Vth)−(PVEE+Voled)=Vdata−Vint+Vth, I=K(Vgs−Vth)$^2$=K(Vdata−Vint)$^2$, that is, the driving current of the dual-gate transistor Md is only related to the potential of the data signal Vdata and the potential of the initial signal Vint, but is not related to the potential of the threshold voltage Vth, so that the drift of the threshold voltage Vth does not affect the magnitude of the driving current, thereby ensuring display brightness evenness.

It should be noted that in the above four phases, that is, in T1 to T4, the compensation for the threshold voltage of the dual-gate transistor Md is implemented only by the external compensation component 108, that is, the external compensation component 108 provides the collected threshold voltage Vth to the second node N2 without using the internal compensation function of the pixel circuit. Therefore, in this embodiment, the problems of uneven display brightness and afterimages due to the drift of the threshold voltage Vth are solved only by the external compensation component 108.

Figure 11:
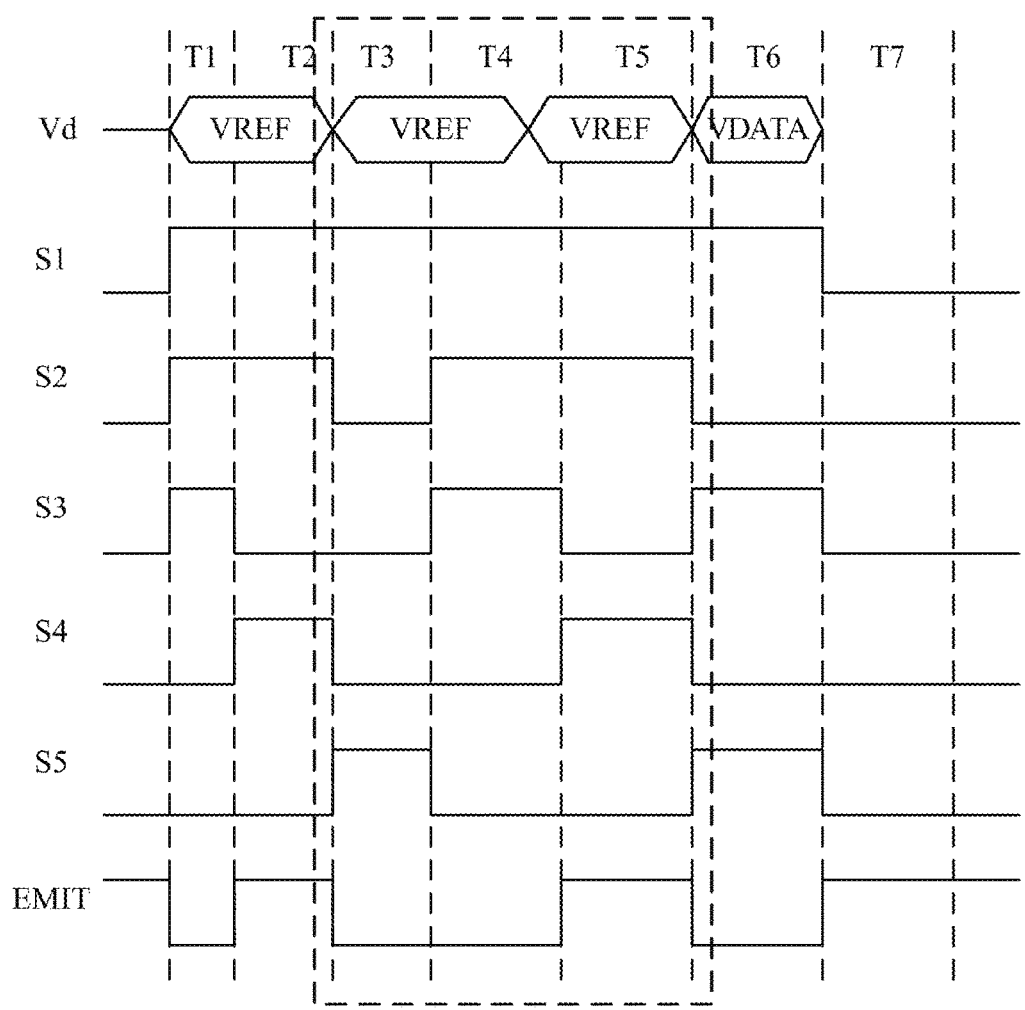
FIG. 11 is an third input-output timing diagram of a pixel circuit according to an embodiment of the present disclosure.

In one embodiment, in the third embodiment, the operating progress of the pixel circuit according to the embodiment of the present disclosure is described by taking the above pixel circuit shown in FIG. 7 as an example and with reference to the input-output timing chart shown in FIG. 11.

In phase T1 which is a first initialization phase, this phase includes initialization of the first node N1, initialization of the second node N2, and initialization of the third node N3, where S1=1, S2=1, S3=1, S4=0, S5=0, EMIT=0, Vd=Vref.

Since S1=1, S2=1 and S3=1, the first switching transistor M1, the second switching transistor M2 and the third switching transistor M3 are all turned on. The first switching transistor M1 transmits to the first node N1 a reference signal Vref input from the data signal terminal Vd, the second switching transistor M2 transmits to the second node N2 a reference signal input from the reference signal terminal Vref. and the third switching transistor M3 transmits to the third node N3 an initial signal input from the initial signal terminal Vint, thus completing initialization of the first gate a and the second gate b of the dual-gate transistor Md and the initialization of the drain. Therefore, in this phase, the potential of the first node N1 is Vref, the potential of the second node N2 is Vref, the potential of the third node N3 is Vint. To be noted, it is preset that Vref−Vint>Vth, that is, the voltage difference between the first node N1 and the third node N3 is greater than the threshold voltage Vth of the dual-gate transistor Md, or the voltage difference between the second node N2 and the third node N3 is greater than the threshold voltage Vth of the dual-gate transistor Md.

In phase T2 which is a first threshold voltage extraction phase, S1=1, S2=1, S3=0, S4=1, S5=0, EMIT=1 and Vd=Vref.

Since S1=1 and S2=1, the first switching transistor M1 and the second switching transistor M2 are turned on, so that the potentials of the first node N1 and the second node N2 are maintained as the potential of the reference signal Vref. Since EMIT=1 and Vref−Vint>Vth, when the fourth switching transistor M4 is turned on, a current flows through the dual-gate transistor Md, so that the first gate a and the drain of the dual-gate transistor Md are turned on, or the second gate b and the drain are turned on. Since S3=0, the third switching transistor M3 is turned off, so that the potential of the third node N3 becomes Vref−Vth. To make the light-emitting diode D emit light, the potential of the third node N3 could be at least PVEE+Voled. However, since it is preset that Vref−Vth<PVEE+Voled, the light-emitting diode D does not emit light in this phase. In addition, since S4=1, the fifth switching transistor M5 is turned on, the potential of the third node N3 is provided to the fourth node N4, so that the potential of the fourth node N4 is Vref−Vth, and under the action of the third capacitor C3, the potential of the fourth node N4 can be maintained at Vref−Vth. Then, through the function of the first comparator 108-2, the threshold voltage Vth at this time is acquired and output to the second comparator 108-3. The second comparator 108-3 compares the input threshold voltage Vth with the standard threshold voltage V0 stored in the memory 108-4. If the input threshold voltage Vth is not the same as the stored standard threshold voltage V0, then the second comparator 108-3 outputs a control voltage Vc corresponding to the threshold voltage Vth and inputs the control voltage Vc to the processor 108-1. If the input threshold voltage Vth is the same as the stored standard threshold voltage V0, then the second comparator 108-3 outputs the standard threshold voltage V0 and inputs the standard threshold voltage V0 to the processor 108-1. Further, when the processor 108-1 receives the control voltage Vc, the processor 108-1 parses the control voltage Vc to determine a compensation voltage corresponding to the control voltage Vc and buffers it. When the processor 108-1 receives the standard threshold voltage V0, the standard threshold voltage V0 is buffered. Therefore, this phase not only implements the extraction of the threshold voltage Vth, but also enables the external compensation component 108 to process the threshold voltage Vth.

Since the external compensation component 108 operates for the first time, the threshold voltage Vth output by the first comparator 108-2 is generally different from the standard threshold voltage V0, so that the second comparator 108-3 outputs the control voltage Vc corresponding to the threshold voltage Vth, and further the processor 108-1 processes the input control voltage Vc and then determines the compensation voltage Vs and buffers it. Therefore, it goes to phase T3, i.e., the threshold voltage correction phase, where S1=1, S2=0, S3=0, S4=0, S5=1, EMIT=0, Vd=Vref.

Since S1=1, the first switching transistor M1 is turned on, the first switching transistor M1 continues to transmit to the first node N1 the reference signal Vref input from the data signal terminal Vd, and maintains the potential of the first node N1 as the potential of the reference signal. Since S5=1, the sixth switching transistor M6 is turned on to transmit the compensation voltage Vs buffered in the processor 108-1 to the second node N2, so that N2=Vs. Of course, the compensation voltage Vs is related to the drift of the threshold voltage Vth. If the threshold voltage Vth is drifted under a positive bias voltage, it is so-called positive drift, then the compensation voltage Vs is a negative voltage. If the threshold voltage Vth is drifted under a negative bias voltage, it is so-called negative drift, then the compensation voltage Vs is a positive voltage, so that the threshold voltage Vth is restored to a normal state, thus correcting the threshold voltage Vth.

In phase T4 which is a second initialization phase, this phase includes initialization of the first node N1, initialization of the second node N2, and initialization of the third node N3, where S1=1, S2=1, S3=1, S4=0, S5=0, EMIT=0, Vd=Vref.

Since the working states of the switching transistors in this phase are consistent with the working states of the switching transistors in the phase T1 (i.e., the first initialization phase), the working process of each switching transistor can be referred to the description of the phase T1, and details are not repeatedly described herein.

In phase T5 which is a second threshold voltage extraction phase, S1=1, S2=1, S3=0, S4=1, S5=0, EMIT=1 and Vd=Vref.

The working states of the switching transistors and the working states of the first comparator 108-2, the second comparator 108-3 and the processor 108-1 in this phase are consistent with those in the aforementioned phase T2 (i.e., the first threshold voltage extraction phase). For details, reference may be made to the description of the foregoing phase T2, and details are not repeatedly described herein.

Of course, since the threshold voltage of the dual-gate transistor Md has been corrected in the phase T3 (i.e., the threshold voltage correction phase), in the T5 phase, the threshold voltage Vth output by the first comparator 108-2 may be the same as the standard threshold voltage V0. Suppose that the second comparator 108-3 outputs the standard threshold voltage V0, it goes to phase T6, i.e., the data writing phase, where S1=1, S2=0, S3=1, S4=0, S5=0, Vd=Vdata.

Since S1=1 and S3=1, the first switching transistor M and the third switching transistor M3 are turned on, so that the potential of the first node N1 is the potential of the data signal Vdata, and the data signal Vdata is stored in the first capacitor C1, and the potential of the third node N3 is the potential of the initial signal Vint, so as to initialize the anode (i.e., the third node N3) of the light-emitting diode D. Since S5=1, the sixth switching transistor M6 is turned on, the standard threshold voltage V0 buffered in the processor 108-1 is transmitted to the second node N2 so that N2=V0.

In phase T7 which is a light emitting phase, S1=0, S2=0, S3=0, S4=0, S5=0 and EMIT=1.

Since S1=0, S2=0, and S3=0, the first switching transistor M1, the second switching transistor M2 and the third switching transistor M3 are all turned off. Since the light emitting control signal input from the light emitting control signal terminal EMIT is a high-level signal, the fourth switching transistor M4 is turned on, and under the action of the data signal Vdata of the first node N1, the dual-gate transistor Md is turned on. In addition, when the light-emitting diode D emits light, the potential of the third node N3 needs to be at least PVEE+Voled. Therefore, when N3=PVEE+Voled, it can be known that the potential variation ΔV of the third node N3 is equal to the potential in the phase T7 subtracted by the potential in phase T6, that is, ΔV=PVEE+Voled−Vint. Due to the action of the second capacitor C2, the potential of the second node N2 changes from the standard threshold voltage V0 in the phase T6 to V0+ΔV, that is, N2=V0+

ΔV=PVEE+Voled−Vint+V0. Therefore, Vgs of the dual-gate transistor Md equals to N1+N2−N3=Vdata+(PVEE+Voled−Vint+V0)−(PVEE+Voled)=Vdata−Vint+V0, I=K(Vgs−V0)²=K(Vdata−Vint)², that is, the driving current of the dual-gate transistor Md is only related to the potential of the data signal Vdata and the potential of the initial signal Vint, but is not related to the threshold voltage Vth, so that the drift of the threshold voltage Vth does not affect the magnitude of the driving current, thus ensuring the display brightness evenness. Meanwhile, since the threshold voltage of the dual-gate transistor Md has been adjusted to the standard threshold voltage V0 prior to this phase, that is, the working state of the dual-gate transistor Md is restored to the factory mode, so that the working states of the dual-gate transistors Md in various pixel circuits are consistent, thus effectively ameliorating the problem of uneven display brightness and afterimages.

Figure 12:
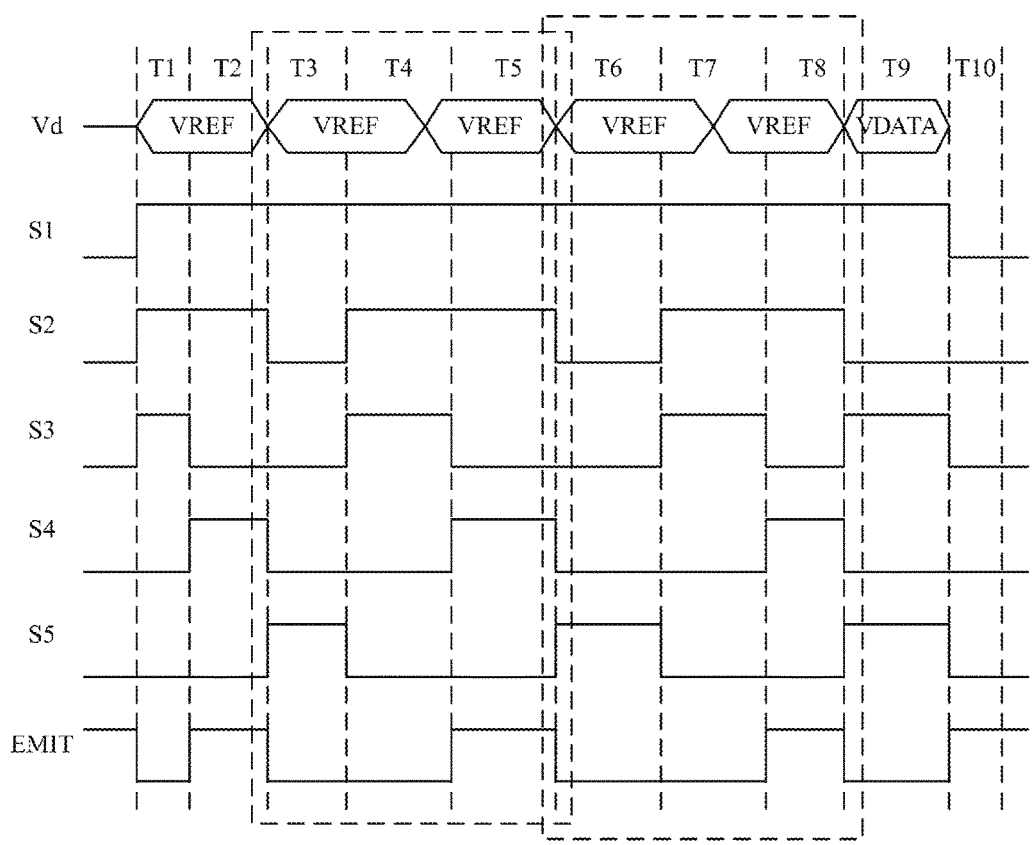
FIG. 12 is an fourth input-output timing diagram of a pixel circuit according to an embodiment of the present disclosure.

It should be noted that during the operating process of the above pixel circuit, there is a loop phase, as shown by the dashed box in FIG. 11. The loop phase includes a threshold voltage correction phase (i.e., phase T3) to a second threshold voltage extraction phase (i.e., the phase T5), and the number of the loop phase is related to the signal output by the second comparator 108-3. That is, before the second comparator 108-3 outputs the standard threshold voltage V0, there is at least one loop phase between the first threshold voltage extraction phase (i.e., the phase T2) and the data writing phase (i.e., the phase T6). In one embodiment, as shown in FIG. 11, the T2 phase can be regarded as the first operation of the second comparator 108-3, the phase T5 can be regarded as the second operation, and if the second comparator 108-3 outputs the standard threshold voltage V0 during the second operation, one loop phase is performed between the phase T2 and the phase T6. If, as shown in FIG. 12, the phase T8 is regarded as the third operation of the second comparator 108-3, and if the second comparator 108-3 outputs the standard threshold voltage V0 at the third operation, two loop phases (one dashed box represents a loop phase) are performed between the first threshold voltage extraction phase and the data writing phase. The rest can be done in the same manner, and when the second comparator 108-3 outputs the standard threshold voltage V0 in the Nth operation, then the N−1 loop phases need to be performed between the first threshold voltage extraction phase and the data writing phase. Thus, the threshold voltage of the dual-gate transistor Md is adjusted to the standard threshold voltage V0 to restore the working state of the dual-gate transistor Md to the factory mode to effectively ameliorating the problems of display unevenness and the afterimages.

Figure 13:
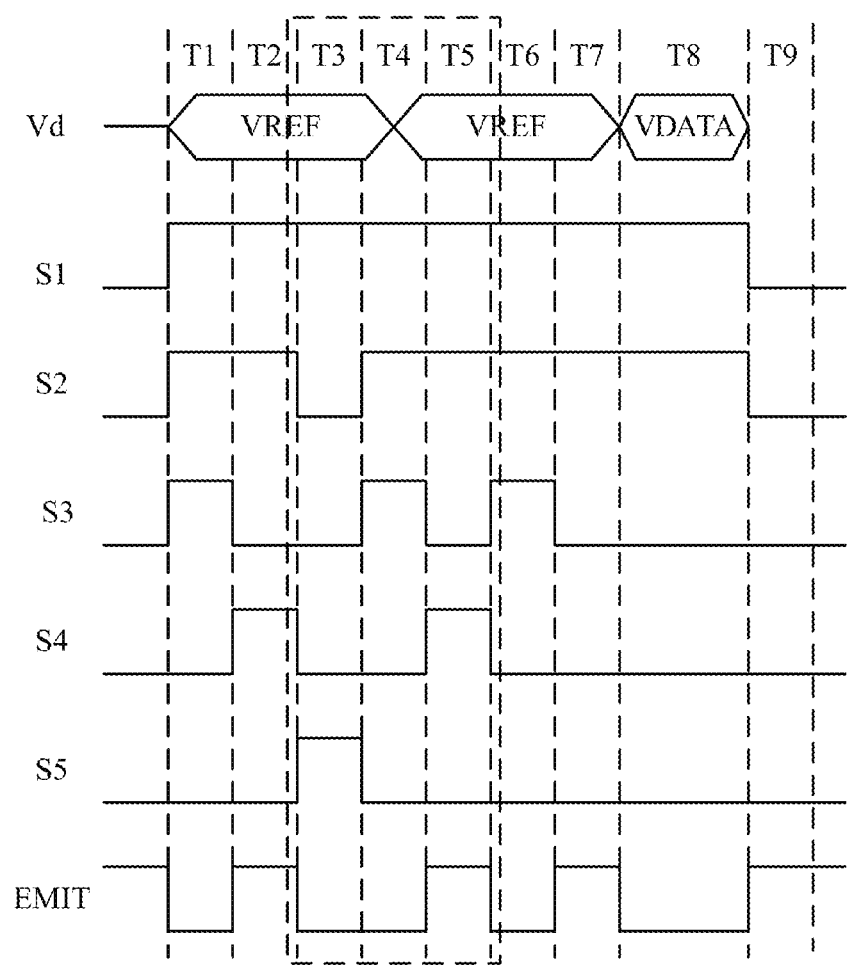
FIG. 13 is an fifth input-output timing diagram of a pixel circuit according to an embodiment of the present disclosure.

In one embodiment, the fourth embodiment is completed based on the third embodiment in combination with the first embodiment. The fourth embodiment is described by taking the above pixel circuit shown in FIG. 7 as an example and with reference to the input-output timing chart shown in FIG. 13. First of all, after the external compensation component 108 completes the correction of the threshold voltage of the dual-gate transistor Md, and then the threshold voltage of the dual-gate transistor Md is compensated again by internal compensation. The working process is as follows.

In phase T1 which is a first initialization phase, this phase includes initialization of the first node N1, initialization of the second node N2, and initialization of the third node N3, where S1=1, S2=1, S3=1, S4=0, S5=0, EMIT=0, Vd=Vref.

Since S1=1, S2=1 and S3=1, the first switching transistor M1, the second switching transistor M2 and the third switching transistor M3 are all turned on. The first switching transistor M1 transmits to the first node N1 a reference signal Vref input from the data signal terminal Vd, the second switching transistor M2 transmits to the second node N2 a reference signal input from the reference signal terminal Vref, and the third switching transistor M3 transmits to the third node N3 an initial signal input from the initial signal terminal Vint, thus completing initialization of the first gate a and the second gate b of the dual-gate transistor Md and the initialization of the drain. Therefore, in this phase, the potential of the first node N1 is Vref, the potential of the second node N2 is Vref, the potential of the third node N3 is Vint. To be noted, it is preset that Vref−Vint>Vth, that is, the voltage difference between the first node N1 and the third node N3 is greater than the threshold voltage Vth of the dual-gate transistor Md, or the voltage difference between the second node N2 and the third node N3 is greater than the threshold voltage Vth of the dual-gate transistor Md.

In phase T2 which is a first threshold voltage extraction phase, S1=1, S2=1, S3=0, S4=1, S5=0, EMIT=1 and Vd=Vref.

Since S1=1 and S2=1, the first switching transistor M1 and the second switching transistor M2 are turned on, so that the potentials of the first node N1 and the second node N2 are maintained as the potential of the reference signal Vref. Since EMIT=1 and Vref−Vint>Vth, when the fourth switching transistor M4 is turned on, a current flows through the dual-gate transistor Md, so that the first gate a and the drain of the dual-gate transistor Md are turned on, or the second gate b and the drain are turned on. Since S3=0, the third switching transistor M3 is turned off, so that the potential of the third node N3 becomes Vref−Vth. To make the light-emitting diode D emit light, the potential of the third node N3 could be at least PVEE+Voled. However, since it is preset that Vref−Vth<PVEE+Voled, the light-emitting diode D does not emit light in this phase. In addition, since S4=1, the fifth switching transistor M5 is turned on, the potential of the third node N3 is provided to the fourth node N4, so that the potential of the fourth node N4 is Vref−Vth, and under the action of the third capacitor C3, the potential of the fourth node N4 can be maintained at Vref−Vth. Then, through the function of the first comparator 108-2, the threshold voltage Vth at this time is acquired and output to the second comparator 108-3. The second comparator 108-3 compares the input threshold voltage Vth with the standard threshold voltage V0 stored in the memory 108-4. If the input threshold voltage Vth is not the same as the stored standard threshold voltage V0, then the second comparator 108-3 outputs a control voltage Vc corresponding to the threshold voltage Vth and inputs the control voltage Vc to the processor 108-1. If the input threshold voltage Vth is the same as the stored standard threshold voltage V0, then the second comparator 108-3 outputs the standard threshold voltage V0 and inputs the standard threshold voltage V0 to the processor 108-1. Further, when the processor 108-1 receives the control voltage Vc, the processor 108-1 parses the control voltage Vc to determine a compensation voltage corresponding to the control voltage Vc and buffers it. When the processor 108-1 receives the standard threshold voltage V0, the standard threshold voltage V0 is buffered. Therefore, this phase not only implements the extraction of the threshold voltage Vth, but also enables the external compensation component 108 to process the threshold voltage Vth.

Since the external compensation component 108 operates for the first time, the threshold voltage Vth output by the first comparator 108-2 is generally different from the standard threshold voltage V0, so that the second comparator 108-3 outputs the control voltage Vc corresponding to the threshold voltage Vth, and further the processor 108-1 processes the input control voltage Vc and then determines the compensation voltage Vs and buffers it. Therefore, it goes to phase T3. i.e., the threshold voltage correction phase, where S1=1, S2=0, S3=0, S4=0, S5=1, EMIT=0, Vd=Vref.

Since S1=1, the first switching transistor M1 is turned on, the first switching transistor M1 continues to transmit to the first node N1 the reference signal Vref input from the data signal terminal Vd, and maintains the potential of the first node N1 as the potential of the reference signal. Since S5=1, the sixth switching transistor M6 is turned on to transmit the compensation voltage Vs buffered in the processor 108-1 to the second node N2, so that N2=Vs. Of course, the compensation voltage Vs is related to the drift of the threshold voltage Vth. If the threshold voltage Vth is drifted under a positive bias voltage, it is so-called positive drift, then the compensation voltage Vs is a negative voltage. If the threshold voltage Vth is drifted under a negative bias voltage, it is so-called negative drift, then the compensation voltage Vs is a positive voltage, so that the threshold voltage Vth is restored to a normal state, thus correcting the threshold voltage Vth.

In phase T4 which is a second initialization phase, this phase includes initialization of the first node N1, initialization of the second node N2, and initialization of the third node N3, where S1=1, S2=1, S3=1, S4=0, S5=0, EMIT=0, Vd=Vref.

Since the working states of the switching transistors in this phase are consistent with the working states of the switching transistors in the phase T1 (i.e., the first initialization phase), the working process of each switching transistor can be referred to the description of the phase T1, and details are not repeatedly described herein.

In phase T5 which is a second threshold voltage extraction phase, S1=1, S2=1, S3=0, S4=1, S5=0, EMIT=1 and Vd=Vref.

The working states of the switching transistors and the working states of the first comparator 108-2, the second comparator 108-3 and the processor 108-1 in this phase are consistent with those in the aforementioned phase T2 (i.e., the first threshold voltage extraction phase). For details, reference may be made to the description of the foregoing phase T2, and details are not repeatedly described herein.

Of course, since the threshold voltage of the dual-gate transistor Md has been corrected in the phase T3 (i.e., the threshold voltage correction phase), in the T5 phase, the threshold voltage Vth output by the first comparator 108-2 may be the same as the standard threshold voltage V0. Suppose that the second comparator 108-3 outputs the standard threshold voltage V0, it goes to the third initialization phase, i.e., the phase T6, and this phase includes initialization of the first node N1, initialization of the second node N2, and initialization of the third node N3, where S1=1, S2=1, S3=1, S4=0, S5=0, EMIT=0, Vd=Vref.

Since the working states of the switching transistors in this phase are consistent with the working states of the switching transistors in the phase T1 (i.e., the first initialization phase), the working process of each switching transistor can be referred to the description of the phase T1, and details are not repeatedly described herein.

In phase T7 which is a third threshold voltage extraction phase. S1=1, S2=1, S3=0, S4=0, S5=0, EMIT=1 and Vd=Vref.

Since S1=1 and S2=1, the first switching transistor M1 and the second switching transistor M2 are turned on, so that the potentials of the first node N1 and the second node N2 are maintained as the potential of the reference signal Vref. Since EMIT=1 and Vref−Vint>V0, when the fourth switching transistor M4 is turned on, a current flows through the dual-gate transistor Md, so that the first gate a and the drain of the dual-gate transistor Md are turned on, or the second gate b and the drain are turned on. Since S3=0, the third switching transistor M3 is turned off. Since the threshold voltage of the dual-gate transistor Md has been corrected to be the standard threshold voltage V0, the potential of the third node N3 becomes Vref−V0. To make the light-emitting diode D emit light, the potential of the third node N3 needs to be at least PVEE+Vole. Since it is preset that Vref−V0<PVEE+Voled, the light-emitting diode D does not emit light in this phase.

In phase T8 which is a data writing phase, S=1, S2=1, S3=0, S4=0, S5=0, EMIT=0 and Vd=Vdata.

Since S1=1 and S2=1, the first switching transistor M1 and the second switching transistor M2 are turned on, so that the potential of the first node N1 is the potential of a data signal Vdata, and the data signal Vdata is stored in the first capacitor C1, and the potential of the second node N2 is maintained as the potential of the reference signal Vref. Since the third switching transistor M3 is turned off, the potential of the third node N3 is maintained at Vref−V0 under the action of the second capacitor C2, and the light-emitting diode D does not emit light in this phase either.

In phase T9 which is a light emitting phase, S1=0, S2=0, S3=0, S4=0, S5=0 and EMIT=1.

Since S1=0, S2=0, and S3=0, the first switching transistor M1, the second switching transistor M2 and the third switching transistor M3 are all turned off. Since the light emitting control signal input from the light emitting control signal terminal EMIT is a high-level signal, the fourth switching transistor M4 is turned on, and under the action of the data signal Vdata of the first node N1, the dual-gate transistor Md is turned on. In addition, when the light-emitting diode D emits light, the potential of the third node N3 needs to be at least PVEE+Voled. Therefore, when N3=PVEE+Voled, it can be known that the potential variation ΔV of the third node N3 is equal to the potential in the phase T9 subtracted by the potential in phase T8, that is, ΔV=PVEE+Voled−(Vref−V0)=PVEE+Voled−Vref+V0. Due to the action of the second capacitor C2, the potential of the second node N2 changes from the potential of the reference signal Vref in the phase T3 to Vref+ΔV, that is, N2=Vref+ΔV=PVEE+Voled+V0. Therefore, Vgs of the dual-gate transistor Md equals to N1+N2−N3=Vdata+(PVEE+Voled+V0)−(PVEE+Voled)=Vdata+V0, I=K(Vgs−V0)$^2$=K(Vdata)$^2$, that is, the driving current of the dual-gate transistor Md is only related to the potential of the data signal Vdata, but is not related to the threshold voltage, so that the drift of the threshold voltage Vth does not affect the magnitude of the driving current, thus ensuring the display brightness evenness. Meanwhile, since the threshold voltage of the dual-gate transistor Md has been adjusted to the standard threshold voltage V0 prior to this phase, that is, the working state of the dual-gate transistor Md is restored to the factory mode, so that the working states of the dual-gate transistors Md in various pixel circuits are consistent, thus effectively ameliorating the problem of uneven display brightness and afterimages.

It should be noted that in this embodiment, it can be understood as a combination of the first embodiment and the third embodiment, that is, in this embodiment, the working states of various phases before the second comparator 108-3 outputs the standard threshold voltage V0 are the same as those before the second comparator 108-3 outputs the standard threshold voltage V0 in the third embodiment, so as to correct the threshold voltage of the dual-gate transistor Md.

Once the second comparator 108-3 outputs the standard threshold voltage V0, the fifth switching transistor M5 and the sixth switching transistor M6 are both turned off, and then the working states of the following phases are the same as those in the first embodiment, that is, the threshold voltage of the dual-gate transistor Md is corrected again through internal compensation so as to fully solve the problems of afterimages and uneven display brightness.

Of course, in the fourth embodiment, there is also at least one loop phase, and the loop phase is between the first threshold voltage extraction phase (i.e., the phase T2) and the third initialization phase (i.e., the phase T6) (as shown by the dashed box in FIG. 13), and the number of the loop phases is also related to the signal output by the second comparator 108-3. For details, reference may be made to the third embodiment, and details are not repeatedly described herein.

Figure 14:
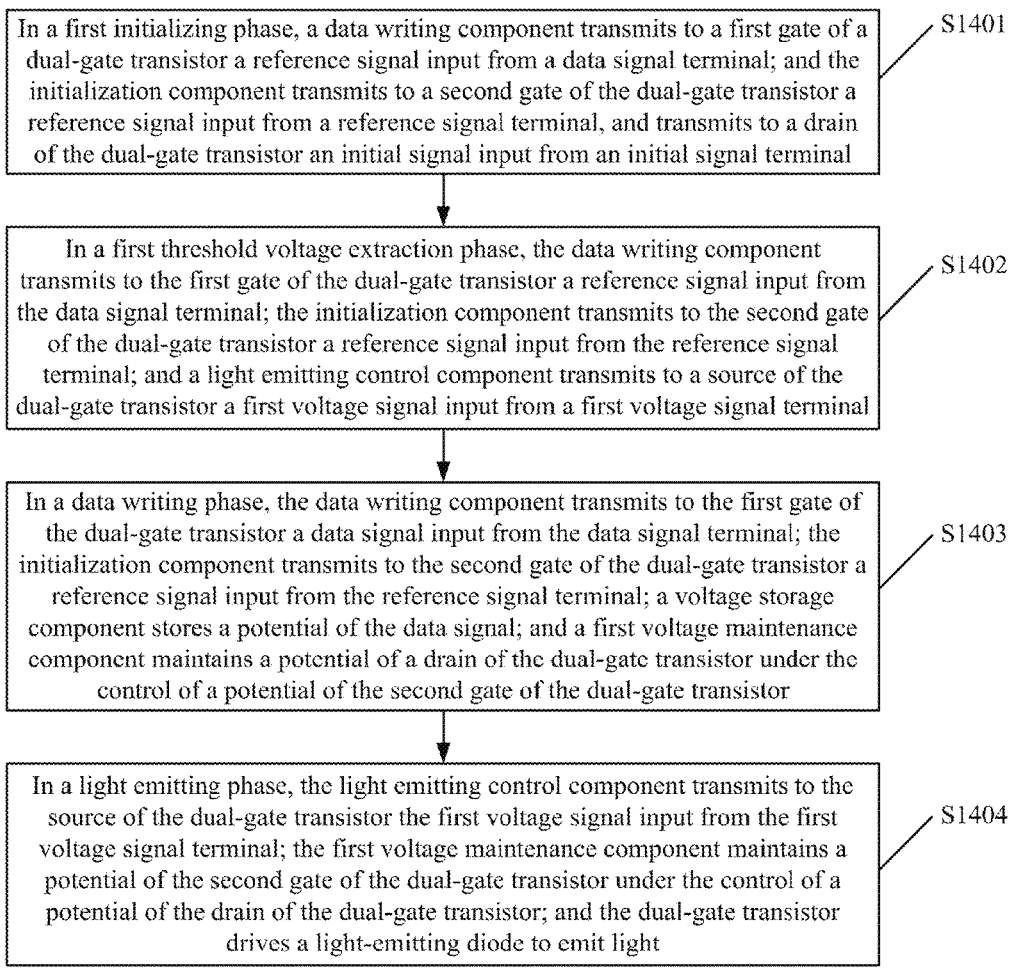
FIG. 14 is a first flowchart of a driving method according to an embodiment of the present disclosure.

Based on the same inventive concept, an embodiment of the present disclosure further provides a driving method of the above pixel circuit provide in the embodiments of the present disclosure, as shown in FIG. 14, the driving method may include the following steps.

S1401: in a first initializing phase, a data writing component transmits to a first gate of a dual-gate transistor a reference signal input from a data signal terminal; and the initialization component transmits to a second gate of the dual-gate transistor a reference signal input from a reference signal terminal, and transmits to a drain of the dual-gate transistor an initial signal input from an initial signal terminal.

S1402: in a first threshold voltage extraction phase, the data writing component transmits to the first gate of the dual-gate transistor a reference signal input from the data signal terminal; the initialization component transmits to the second gate of the dual-gate transistor a reference signal input from the reference signal terminal; and a light emitting control component transmits to a source of the dual-gate transistor a first voltage signal input from a first voltage signal terminal.

S1403: in a data writing phase, the data writing component transmits to the first gate of the dual-gate transistor a data signal input from the data signal terminal; the initialization component transmits to the second gate of the dual-gate transistor a reference signal input from the reference signal terminal; a voltage storage component stores a potential of the data signal; and a first voltage maintenance component maintains a potential of a drain of the dual-gate transistor under the control of a potential of the second gate of the dual-gate transistor.

S1404: in a light emitting phase, the light emitting control component transmits to the source of the dual-gate transistor the first voltage signal input from the first voltage signal terminal; the first voltage maintenance component maintains a potential of the second gate of the dual-gate transistor under the control of a potential of the drain of the dual-gate transistor; and the dual-gate transistor drives a light-emitting diode to emit light.

In one implementation, among the four steps in the above driving method according to the embodiments of the present disclosure, in the first initialization phase, the first scan signal terminal provides a first level signal, the second scan signal terminal provides a first level signal, the third scan signal terminal provides a first level signal, the fourth scan signal terminal provides a second level signal, the fifth scan signal terminal provides a second level signal, the light emitting control signal terminal provides a second level signal, and the data signal terminals provides a reference signal.

In the first threshold voltage extraction phase, the first scan signal terminal provides a first level signal, the second scan signal terminal provides a first level signal, the third scan signal terminal provides a second level signal, the fourth scan signal terminal provides a second level signal, the fifth scan signal terminal provides a second level signal, the light emitting control signal terminal provides a first level signal, and the data signal terminals provides a reference signal.

In the data writing phase, the first scan signal terminal provides a first level signal, the second scan signal terminal provides a first level signal, the third scan signal terminal provides a second level signal, the fourth scan signal terminal provides a second level signal, the fifth scan signal terminal provides a second level signal, the light emitting control signal terminal provides a second level signal, and the data signal terminal provides a data signal.

In the light emitting phase, the first scan signal terminal provides a second level signal, the second scan signal terminal provides a second level signal, the third scan signal terminal provides a second level signal, the fourth scan signal terminal provides a second level signal, the fifth scan signal terminal provides a second level signal, the light emitting control signal terminal provides a first level signal.

In one embodiment, in the above driving method according to the embodiment of the present disclosure, before the first initialization phase and when the external compensation component includes a first comparator, a second comparator, a processor and a memory, the driving method further includes: a second initialization phase, a second threshold voltage extraction phase and at least one loop phase. The loop phase includes: a threshold voltage correction phase, a third initialization phase and a third threshold voltage extraction phase. The loop phase ends when the second comparator outputs a standard threshold voltage.

In the second initialization phase, the first scan signal terminal provides a first level signal, the second scan signal terminal provides a first level signal, the third scan signal terminal provides a first level signal, and the fourth scan signal terminal provides a second level signal. The fifth scan signal terminal provides a second level signal. The light emitting control signal terminal provides a second level signal, and the data signal terminal provides a reference signal.

In the second threshold voltage extraction phase, the first scan signal terminal provides a first level signal, the second scan signal terminal provides a first level signal, and the third scan signal terminal provides a second level signal. The fourth scan signal terminal provides a first level signal. The fifth scan signal terminal provides a second level signal. The light emitting control signal terminal provides a first level signal, and the data signal terminal provides a reference signal.

In the threshold voltage correction phase, the first scan signal terminal provides a first level signal, the second scan signal terminal provides a second level signal, the third scan signal terminal provides a second level signal, and the fourth scan signal terminal provides a second level signal. The fifth scan signal terminal provides a first level signal. The light emitting control signal terminal provides a second level signal, and the data signal terminal provides a reference signal.

In the third initialization phase, the first scan signal terminal provides a first level signal, the second scan signal terminal provides a first level signal, the third scan signal terminal provides a first level signal, and the fourth scan signal terminal provides a second level signal. The fifth scan signal terminal provides a second level signal. The light emitting control signal terminal provides a second level signal, and the data signal terminal provides a reference signal.

In the third threshold voltage extraction phase, the first scan signal terminal provides a first level signal, the second scan signal terminal provides a first level signal, and the third scan signal terminal provides a second level signal. The fourth scan signal terminal provides a first level signal. The fifth scan signal terminal provides a second level signal. The light emitting control signal terminal provides a first level signal, and the data signal terminal provides a reference signal.

Figure 15:
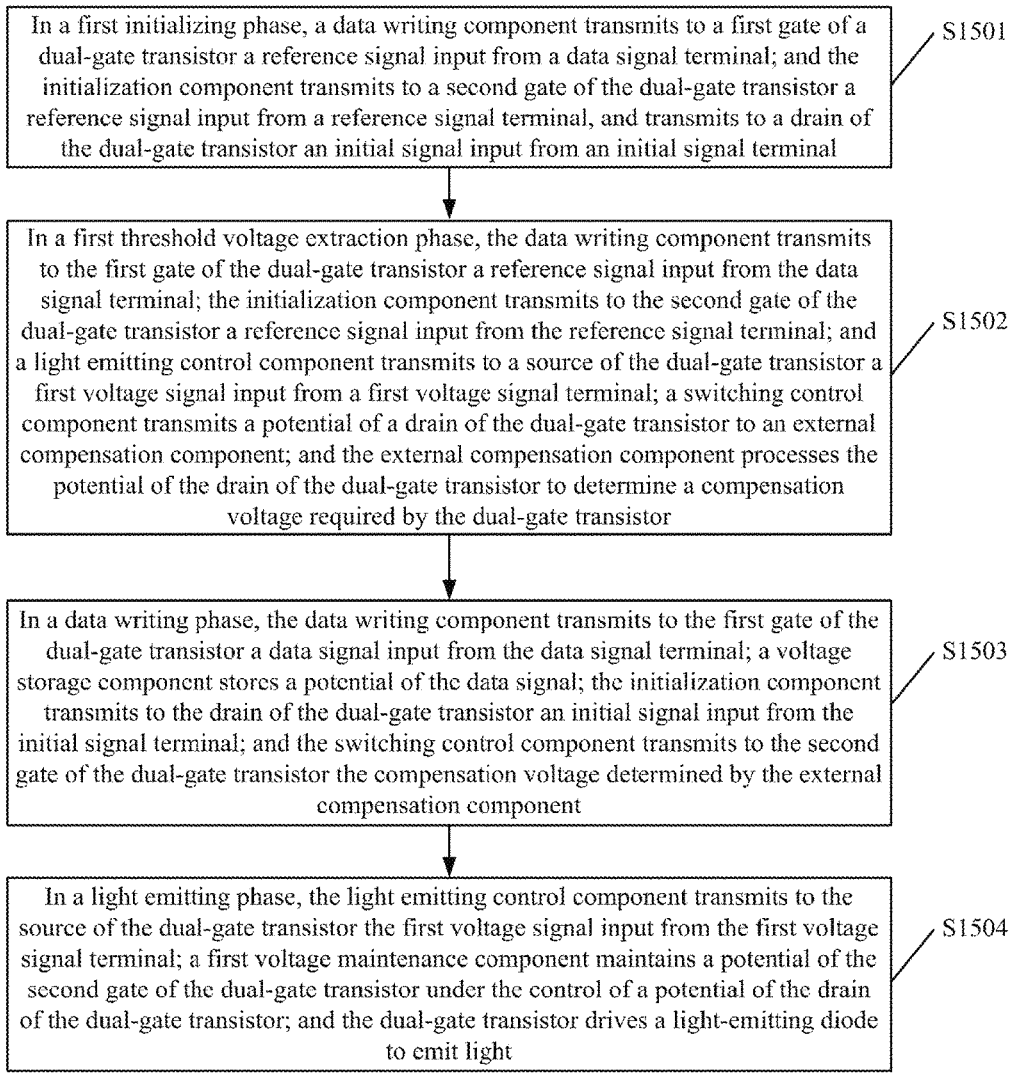
FIG. 15 is a second flowchart of a driving method according to an embodiment of the present disclosure.

Based on the same inventive concept, an embodiment of the present disclosure further provides a driving method of the above pixel circuit provide in the embodiments of the present disclosure, as shown in FIG. 15, the driving method may include the following steps.

S1501: in a first initializing phase, a data writing component transmits to a first gate of a dual-gate transistor a reference signal input from a data signal terminal; and the initialization component transmits to a second gate of the dual-gate transistor a reference signal input from a reference signal terminal, and transmits to a drain of the dual-gate transistor an initial signal input from an initial signal terminal.

S1502: in a first threshold voltage extraction phase, the data writing component transmits to the first gate of the dual-gate transistor a reference signal input from the data signal terminal; the initialization component transmits to the second gate of the dual-gate transistor a reference signal input from the reference signal terminal; and a light emitting control component transmits to a source of the dual-gate transistor a first voltage signal input from a first voltage signal terminal; a switching control component transmits a potential of a drain of the dual-gate transistor to an external compensation component; and the external compensation component processes the potential of the drain of the dual-gate transistor to determine a compensation voltage necessary for the dual-gate transistor.

S1503: in a data writing phase, the data writing component transmits to the first gate of the dual-gate transistor a data signal input from the data signal terminal; a voltage storage component stores a potential of the data signal; the initialization component transmits to the drain of the dual-gate transistor an initial signal input from the initial signal terminal; and the switching control component transmits to the second gate of the dual-gate transistor the compensation voltage determined by the external compensation component.

S1504: in a light emitting phase, the light emitting control component transmits to the source of the dual-gate transistor the first voltage signal input from the first voltage signal terminal; a first voltage maintenance component maintains a potential of the second gate of the dual-gate transistor under the control of a potential of the drain of the dual-gate transistor; and the dual-gate transistor drives a light-emitting diode to emit light.

In one implementation, among the four steps in the above driving method according to the embodiments of the present disclosure, in the first initialization phase, the first scan signal terminal provides a first level signal, the second scan signal terminal provides a first level signal, the third scan signal terminal provides a first level signal, and the fourth scan signal terminal provides a second level signal. The fifth scan signal terminal provides a second level signal, the light emitting control signal terminal provides a second level signal, and the data signal terminals provides a reference signal.

In the first threshold voltage extraction phase, the first scan signal terminal provides a first level signal, the second scan signal terminal provides a first level signal, and the third scan signal terminal provides a second level signal, and the fourth scan signal terminal provides a first level signal. The fifth scan signal terminal provides a second level signal. The light emitting control signal terminal provides a first level signal, and the data signal terminal provides a reference signal.

In the data writing phase, the first scan signal terminal provides a first level signal, the second scan signal terminal provides a second level signal, the third scan signal terminal provides a first level signal, and the fourth scan signal terminal provides a second level signal. The fifth scan signal terminal provides a first level signal, the light emitting control signal terminal provides a second level signal, and the data signal terminals provides a data signal.

In the light emitting phase, the first scan signal terminal provides a second level signal, the second scan signal terminal provides a second level signal, the third scan signal terminal provides a second level signal, and the fourth scan signal terminal provides a second level signal. The fifth scan signal terminal provides a second level signal, and the light emitting control signal terminal provides a first level signal.

In one embodiment, in the above driving method according to the embodiment of the present disclosure, when the external compensation component includes the second comparator, and between the first threshold voltage extraction phase and the data writing phase, the driving method further includes at least one loop phase. The loop phase ends when the second comparator outputs the standard threshold voltage. The loop phase includes: a threshold voltage correction phase, a second initialization phase and a second threshold voltage extraction phase.

In the threshold voltage correction phase, the first scan signal terminal provides a first level signal, the second scan signal terminal provides a second level signal, the third scan signal terminal provides a second level signal, and the fourth scan signal terminal provides a second level signal. The fifth scan signal terminal provides a first level signal. The light emitting control signal terminal provides a second level signal, and the data signal terminal provides a reference signal.

In the second initialization phase, the first scan signal terminal provides a first level signal, the second scan signal terminal provides a first level signal, the third scan signal terminal provides a first level signal, and the fourth scan signal terminal provides a second level signal. The fifth scan signal terminal provides a second level signal. The light emitting control signal terminal provides a second level signal, and the data signal terminal provides a reference signal.

Figure 16:
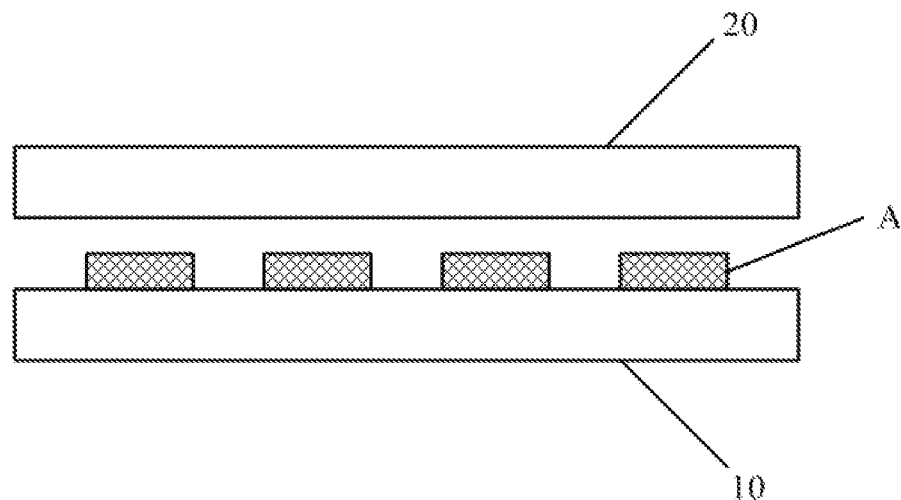
FIG. 16 is a first structural schematic diagram of an electroluminescent display panel according to an embodiment of the present disclosure.
Figure 17:
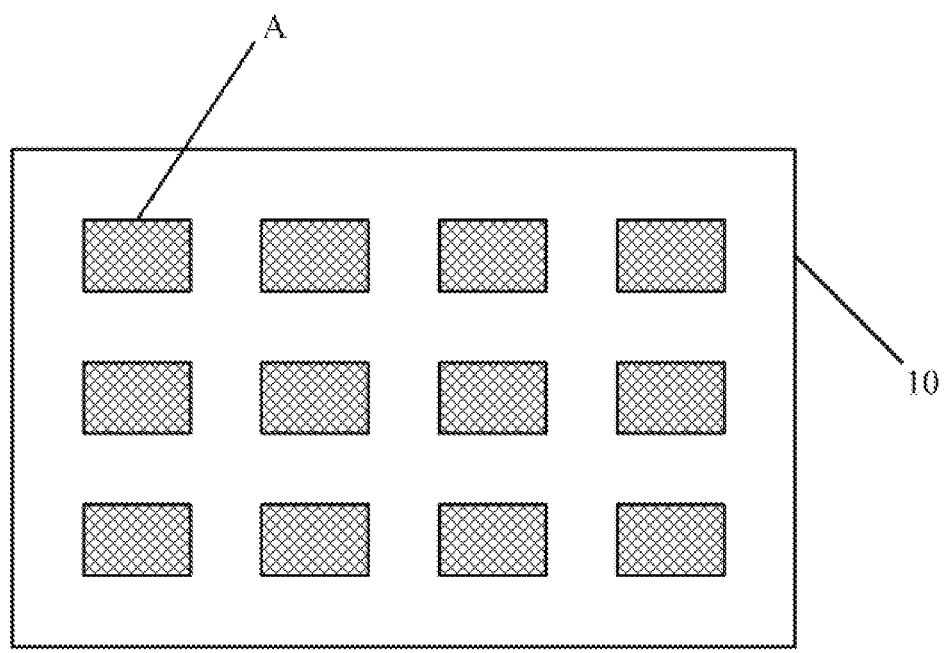
FIG. 17 is a second structural schematic diagram of an electroluminescent display panel according to an embodiment of the present disclosure.

In the second threshold voltage extraction phase, the first scan signal terminal provides a first level signal, the second scan signal terminal provides a first level signal, and the third scan signal terminal provides a second level signal. The fourth scan signal terminal provides a first level signal. The fifth scan signal terminal provides a second level signal. The light emitting control signal terminal provides a first level signal, and the data signal terminal provides a reference signal;

Based on the same inventive concept, an embodiment of the present disclosure further provides a display device, which may include an electroluminescent display panel. The electroluminescent display panel may include a plurality of the above pixel circuits according to the embodiments of the present disclosure arranged in an array, as shown in FIG. 16 and FIG. 17. The principle of solving the problem of the electroluminescent display panel is similar to that of the pixel circuit described above. Therefore, for the implementation of the electroluminescent display panel, reference may be made to the implementation of the pixel circuit described above, and details are not repeatedly described herein. In addition, the display device may be any product or component having a display function, such as a mobile phone, a tablet computer, a television, a display, a notebook computer, a digital photo frame and a navigator. For the implementation of the display device, reference may be made to the implementation of the electroluminescent display panel, and details are not repeatedly described herein.

In one implementation, in the above display device according to the embodiment of the present disclosure, in the sectional view of the electroluminescent display panel shown in FIG. 16, the electroluminescent display panel includes an array substrate 10 and a cover plate 20 opposite to each other, and a plurality of pixel circuits A arranged in an array are disposed on a side of the array substrate 10, facing the cover plate 20. A top view is shown as FIG. 17, which shows only the array substrate 10 and a plurality of pixel circuits A arranged in an array, and the number of pixel circuits A is not limited to 12 as shown in FIG. 17, which is not limited herein.

Provided are a pixel circuit, a driving method thereof, an electroluminescent display panel and a display device. The pixel circuit includes an initialization component, a data writing component, a light emitting control component, a voltage storage component, a driving transistor, a first voltage maintenance component, a switching control component, an external compensation component and a light-emitting diode. The driving transistor is a dual-gate transistor, and a second gate of the dual-gate transistor is electrically connected to the external compensation component through the switching control component. The external compensation component is under the control of the switching control component to firstly collect the voltage at a third node and then provide a compensation voltage to a second node to adjust the threshold voltage of the dual-gate transistor so that the threshold voltage of the dual-gate transistor is more approximate to a standard threshold voltage. Therefore, the current of the light-emitting diode which is emitting light is independent of the threshold voltage, avoiding the influence of the drift of the threshold voltage on the magnitude of the current, eliminating afterimages and improving the displaying quality.

It will be apparent to those skilled in the art that various changes and modifications can be made in the present disclosure without departing from the spirit and scope of the present disclosure. In this manner, the present disclosure is intended to incorporate such modifications and variations if the modifications and variations of the present disclosure are within the scope of the appended claims of the present disclosure and the equivalents thereof.

The invention claimed is:

1. A display panel comprising:
    a plurality of pixel circuits, each of the pixel circuits comprising:
        an initialization component,
        a data writing component,
        a light emitting control component,
        a voltage storage component,
        a driving transistor,
        a first voltage maintenance component,
        a switching control component,
        an external compensation component, and
        a light-emitting diode, wherein
    the driving transistor is a dual-gate transistor, and is configured to drive the light-emitting diode to emit light;
    the data writing component is configured to transmit to a first gate of the dual-gate transistor a signal input from a data signal terminal;
    the initialization component is configured to transmit to a second gate of the dual-gate transistor a reference signal input from a reference signal terminal, and transmit to a drain of the dual-gate transistor an initial signal input from an initial signal terminal;
    the light emitting control component is configured to transmit to a source of the dual-gate transistor a first voltage signal input from a first voltage signal terminal;
    the voltage storage component is configured to store a potential of a data signal input from the data signal terminal;
    the first voltage maintenance component is configured to maintain a potential of the drain of the dual-gate transistor, or maintain a voltage difference between the second gate and the drain of the dual-gate transistor;
    the switching control component is configured to transmit the potential of the drain of the dual-gate transistor to the external compensation component, and transmit to the second gate of the dual-gate transistor a compensation voltage provided by the external compensation component; and
    the external compensation component is configured to provide a compensation voltage for the dual-gate transistor.

2. The display panel according to claim 1, wherein the external compensation component is configured to collect the potential of the drain of the dual-gate transistor under the control of the switching control component to provide a compensation voltage for the second gate of the dual-gate transistor.

3. The display panel according to claim 2, wherein the external compensation component comprises: a processor;
    a signal input terminal and a signal output terminal of the processor are both electrically connected to the switching control component; and
    the processor is configured to process the collected potential of the drain of the dual-gate transistor and then output the potential.

4. The display panel according to claim 3, wherein the external compensation component further comprises:
    a first comparator arranged between the switching control component and the signal input terminal of the processor;
    the first comparator has a first signal input terminal electrically connected to the switching control component, a second signal input terminal electrically connected to the reference signal terminal, and a signal output terminal electrically connected to the signal input terminal of the processor; the first comparator is configured to output a voltage difference between the first signal input terminal and the second signal input terminal; and
    the processor is further configured to output the voltage difference.

5. The display panel according to claim 4, wherein the external compensation component further comprises: a second comparator arranged between the first comparator and the processor, and a memory electrically connected to the second comparators, wherein, the memory is configured to store a standard threshold voltage;

the second comparator has a first signal input terminal electrically connected to the signal output terminal of the first comparator, a second signal input terminal electrically connected to the memory, and a signal output terminal electrically connected to the signal input terminal of the processor; the second comparator is configured to output a standard threshold voltage when the voltages of the first signal input terminal and the second signal input terminal are the same, and output a control voltage corresponding to the voltage difference when voltages of the first signal input terminal and the second signal input terminal are different; and the processor is further configured to output the received standard threshold voltage or output a corresponding compensation voltage according to the received control voltage.

6. The display panel according to claim 1, the pixel circuit further comprising:

a second voltage maintenance component; and the second voltage maintenance component is configured to maintain the potential of the drain of the dual-gate transistor before the switching control component transmits the potential of the drain of the dual-gate transistor to the external compensation component.

7. A display panel comprising:

a plurality of pixel circuits, each of the pixel circuits comprising: an initialization component, a data writing component, a light emitting control component, a voltage storage component, a driving transistor, a first voltage maintenance component, a switching control component, an external compensation component and a light-emitting diode, wherein the data writing component is electrically connected to a first scan signal terminal at a first terminal, is electrically connected to a data signal terminal at a second terminal, and is electrically connected to a first node at a third terminal; and the data writing component is configured to transmit to the first node a signal input from the data signal terminal, under the control of the first scan signal input from the first scan signal terminal;

the initialization component is electrically connected to a second scan signal terminal at a first terminal, is electrically connected to a reference signal terminal at a second terminal, is electrically connected to a second node at a third terminal, is electrically connected to a third scan signal terminal at a fourth terminal, is electrically connected to an initial signal terminal at a fifth terminal, and is electrically connected to a third node at a sixth terminal; and the initialization component is configured to transmit to the second node a reference signal input from the reference signal terminal under the control of a second scan signal input from the second scan signal terminal, and transmit to the third node an initial signal input from the initial signal terminal under the control of a third scan signal input from the third scan signal terminal;

the first voltage maintenance component is electrically connected to the second node at a first terminal, and is electrically connected to the third node at a second terminal; and the first voltage maintenance component is configured to maintain a potential of the third node under the control of a potential of the second node, and maintain a voltage difference between the second node and the third node;

the light emitting control component is electrically connected to a light emitting control signal terminal at a first terminal, is electrically connected to a first voltage signal terminal at a second terminal, and is electrically connected to a source of the dual-gate transistor at a third terminal; and the light emitting control component is configured to transmit to the source of the dual-gate transistor a first voltage signal input from the first voltage signal terminal under the control of a light-emitting control signal input from the light-emitting control signal terminal;

the voltage storage component is connected between the first voltage signal terminal and the first node;

the driving transistor is a dual-gate transistor, the dual-gate transistor is electrically connected to the first node at a first gate, is electrically connected to the second node at a second gate, and is electrically connected to the third node at a drain of the dual-gate transistor;

the switching control component is electrically connected to a fourth scan signal terminal at a first terminal, is electrically connected to the third node at a second terminal, is electrically connected to a fourth node at a third terminal, is electrically connected to a fifth scan signal terminal at a fourth terminal, is electrically connected to the second node at a fifth terminal, and is electrically connected to a signal output terminal of the external compensation component at a sixth terminal; and the switching control component is configured to provide a potential of the third node to the fourth node under the control of a fourth scan signal input from the fourth scan signal terminal, and transmit to the second node a signal output by the signal output terminal of the external compensation component under the control of a fifth scan signal input from the fifth scan signal terminal;

the external compensation component is electrically connected to the fourth node at a first signal input terminal, and is electrically connected to the reference signal terminal at a second signal input terminal; the external compensation component is configured to collect the voltage of the third node, and provide a compensation voltage to the second node under the control of the switching control component; and the light-emitting diode is connected between the third node and a second voltage signal terminal.

8. The display panel according to claim 7, wherein the external compensation component comprises: a processor;

signal input terminals of the processor are electrically connected to the fourth node and the reference signal terminal respectively, and a signal output terminal of the processor is electrically connected to the sixth terminal of the switching control component; and the processor is configured to process the collected potential of the third node and then output the potential.

9. The display panel according to claim 8, wherein the external compensation component further comprises:

a first comparator arranged between the fourth node and a signal input terminal of the processor;

the first comparator has a first signal input terminal electrically connected to the fourth node, a second signal input terminal electrically connected to the reference signal terminal, and a signal output terminal electrically connected to the signal input terminal of the processor; the first comparator is configured to output a voltage difference between the first signal input terminal and the second signal input terminal; and the processor is further configured to output the voltage difference.

10. The display panel according to claim 9, wherein the external compensation component further comprises:

a second comparator arranged between the first comparator and the processor, and a memory electrically connected to the second comparator, wherein, the memory is configured to store a standard threshold voltage;

the second comparator has a first signal input terminal electrically connected to the signal output terminal of the first comparator, a second signal input terminal electrically connected to the memory, and a signal output terminal electrically connected to the signal input terminal of the processor; the second comparator is configured to output a standard threshold voltage when the voltages of the first signal input terminal and the second signal input terminal are the same, and output a control voltage corresponding to the voltage difference when voltages of the first signal input terminal and the second signal input terminal are different; and the processor is further configured to output the received standard threshold voltage or output a corresponding compensation voltage according to the received control voltage.

11. The display panel according to claim 7, wherein the data writing component comprises:

a first switching transistor; and a gate of the first switching transistor is electrically connected to the first scan signal terminal, a source of the first switching transistor is electrically connected to the data signal terminal, and a drain of the first switching transistor is electrically connected to the first node.

12. The display panel according to claim 7, wherein the initialization component comprises:

a second switching transistor and a third switching transistor;

a gate of the second switching transistor is electrically connected to the second scan signal terminal, a source of the second switching transistor is electrically connected to the reference signal terminal, and a drain of the second switching transistor is electrically connected to the second node; and a gate of the third switching transistor is electrically connected to the third scan signal terminal, a source of the third switching transistor is electrically connected to the initial signal terminal, and a drain of the third switching transistor is electrically connected to the third node.

13. The display panel according to claim 7, wherein the light emitting control component comprises: a fourth switching transistor; and a gate of the fourth switching transistor is electrically connected to the light emitting control signal terminal, a source of the fourth switching transistor is electrically connected to the first voltage signal terminal, and a drain of the fourth switching transistor is electrically connected to a source of the dual-gate transistor.

14. The display panel according to claim 7, wherein the switching control component comprises:

a fifth switching transistor and a sixth switching transistor;

a gate of the fifth switching transistor is electrically connected to the fourth scan signal terminal, a source of the fifth switching transistor is electrically connected to the third node, and a drain of the fifth switching transistor is electrically connected to the fourth node; and a gate of the sixth switching transistor is electrically connected to the fifth scan signal terminal, a source of the sixth switching transistor is electrically connected to the signal output terminal of the external compensation component, and a drain of the sixth switching transistor is electrically connected to the second node.

15. The display panel according to claim 7, wherein the voltage storage component comprises:

a first capacitor, wherein the first capacitor is connected between the first node and the first voltage signal terminal.

16. The pixel circuit according to claim 7, wherein the first voltage maintenance component comprises:

a second capacitor, wherein the second capacitor is connected between the second node and the third node.

17. The display panel according to claim 7, the pixel circuit further comprising:

a second voltage maintenance component; and a first terminal of the second voltage maintenance component is electrically connected to the fourth node, and a second terminal of the second voltage maintenance component is electrically connected to a ground signal terminal; the second voltage maintenance component is configured to maintain the potential of the fourth node under the control of a ground signal input from the ground signal terminal.

18. The display panel according to claim 17, wherein the second voltage maintenance component comprises:

a third capacitor, wherein the third capacitor is connected between the fourth node and the ground signal terminal.

19. The display panel according to claim 7, wherein the switching transistors are N-type transistors and the dual-gate transistor is an N-type transistor.

20. A display device comprising:

a display panel, the display panel comprising a plurality of pixel circuits, each of the pixel circuits comprising: an initialization component, a data writing component, a light emitting control component, a voltage storage component, a driving transistor, a first voltage maintenance component, a switching control component, an external compensation component and a light-emitting diode, wherein the data writing component is electrically connected to a first scan signal terminal at a first terminal, is electrically connected to a data signal terminal at a second terminal, and is electrically connected to a first node at a third terminal; and the data writing component is configured to transmit to the first node a signal input from the data signal terminal, under the control of the first scan signal input from the first scan signal terminal;

the initialization component is electrically connected to a second scan signal terminal at a first terminal, is electrically connected to a reference signal terminal at a second terminal, is electrically connected to a second node at a third terminal, is electrically connected to a third scan signal terminal at a fourth terminal, is electrically connected to an initial signal terminal at a fifth terminal, and is electrically connected to a third node at a sixth terminal, and the initialization component is configured to transmit to the second node a reference signal input from the reference signal terminal under the control of a second scan signal input from the second scan signal terminal, and transmit to the third node an initial signal input from the initial signal terminal under the control of a third scan signal input from the third scan signal terminal;

the first voltage maintenance component is electrically connected to the second node at a first terminal, and is electrically connected to the third node at a second terminal; and the first voltage maintenance component is configured to maintain a potential of the third node under the control of a potential of the second node, and maintain a voltage difference between the second node and the third node;

the light emitting control component is electrically connected to a light emitting control signal terminal at a first terminal, is electrically connected to a first voltage signal terminal at a second terminal, and is electrically connected to a source of the dual-gate transistor at a third terminal; and the light emitting control component is configured to transmit to the source of the dual-gate transistor a first voltage signal input from the first voltage signal terminal under the control of a light-emitting control signal input from the light-emitting control signal terminal;

the voltage storage component is connected between the first voltage signal terminal and the first node;

the driving transistor is a dual-gate transistor, the dual-gate transistor is electrically connected to the first node at a first gate, is electrically connected to the second node at a second gate, and is electrically connected to the third node at a drain of the dual-gate transistor;

the switching control component is electrically connected to a fourth scan signal terminal at a first terminal, is electrically connected to the third node at a second terminal, is electrically connected to a fourth node at a third terminal, is electrically connected to a fifth scan signal terminal at a fourth terminal, is electrically connected to the second node at a fifth terminal, and is electrically connected to a signal output terminal of the external compensation component at a sixth terminal; and the switching control component is configured to provide a potential of the third node to the fourth node under the control of a fourth scan signal input from the fourth scan signal terminal, and transmit to the second node a signal output by the signal output terminal of the external compensation component under the control of a fifth scan signal input from the fifth scan signal terminal;

the external compensation component is electrically connected to the fourth node at a first signal input terminal, and is electrically connected to the reference signal terminal at a second signal input terminal; the external compensation component is configured to collect the voltage of the third node, and provide a compensation voltage to the second node under the control of the switching control component; and the light-emitting diode is connected between the third node and a second voltage signal terminal.

* * * * *